(12) United States Patent
Ibayashi et al.

(10) Patent No.: US 7,817,263 B2
(45) Date of Patent: Oct. 19, 2010

(54) MOUNTING APPARATUS, INSPECTING APPARATUS, INSPECTING METHOD, AND MOUNTING METHOD

(75) Inventors: Yoshihiro Ibayashi, Chiba (JP); Yukio Kawazu, Saitama (JP)

(73) Assignee: Sony Corporation, Tokyo (JP)

( * ) Notice: Subject to any disclaimer, the term of this patent is extended or adjusted under 35 U.S.C. 154(b) by 32 days.

(21) Appl. No.: 12/379,728

(22) Filed: Feb. 27, 2009

(65) Prior Publication Data

US 2009/0251701 A1    Oct. 8, 2009

(30) Foreign Application Priority Data

Apr. 3, 2008    (JP)    ............................. 2008-096777

(51) Int. Cl.
  *G01N 21/00*    (2006.01)
(52) U.S. Cl. ................................... 356/237.2
(58) Field of Classification Search ............. 356/237.2, 356/237.5; 427/10, 96.1
  See application file for complete search history.

(56) References Cited

U.S. PATENT DOCUMENTS

2002/0009536 A1*    1/2002    Iguchi et al. ................. 427/10

2007/0229810 A1*    10/2007    Kaya ....................... 356/237.2

FOREIGN PATENT DOCUMENTS

| JP | 2005-019380 | 1/2005 |
| JP | 2008-216140 A | 9/2008 |

* cited by examiner

*Primary Examiner*—Roy Punnoose
(74) *Attorney, Agent, or Firm*—Rader, Fishman & Grauer PLLC

(57) ABSTRACT

A mounting apparatus includes a coating unit, an acquiring portion, a judging portion, and a mounting mechanism. The coating unit coats a first region of a coating target component as a coating target region with a coating agent. The acquiring portion acquires first luminance information of the first region before being coated by the coating unit and second luminance information of the first region after being coated by the coating unit. The judging portion judges a quality of a coating state of the coating agent in the first region by comparing the first luminance information and the second luminance information. The mounting mechanism mounts, on a mounting target object, the coating target component judged by the judging portion that the coating state in the first region is favorable.

11 Claims, 16 Drawing Sheets

FIG. 4
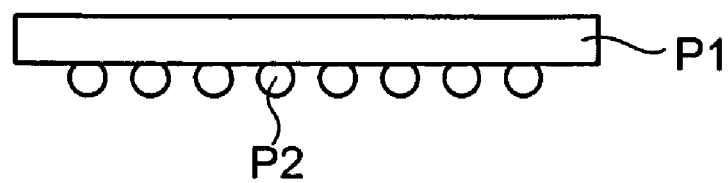
FIG.4A
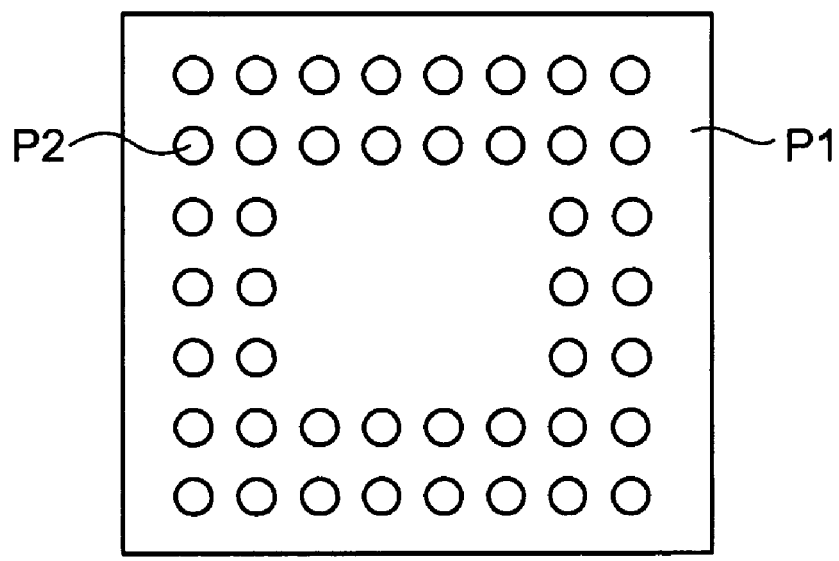
FIG.4B

FIG. 5
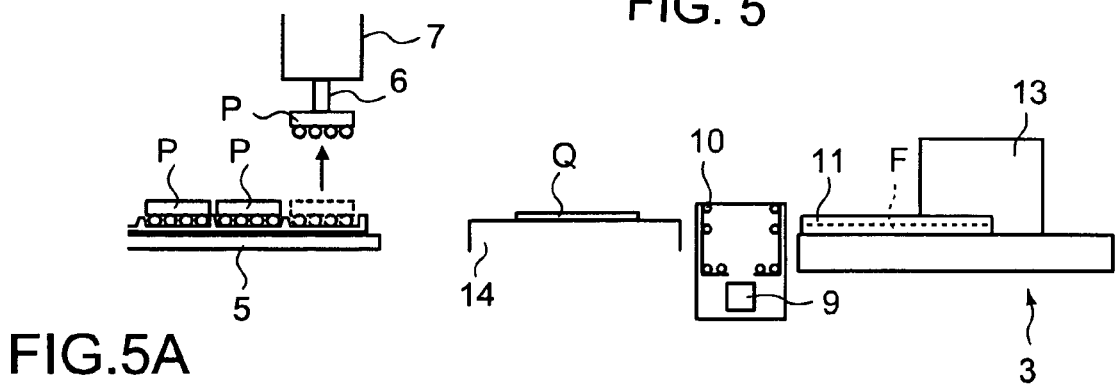
FIG.5A
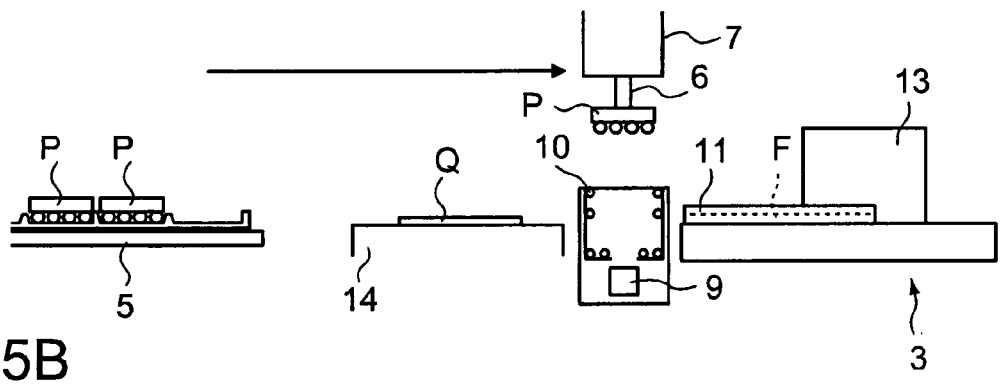
FIG.5B
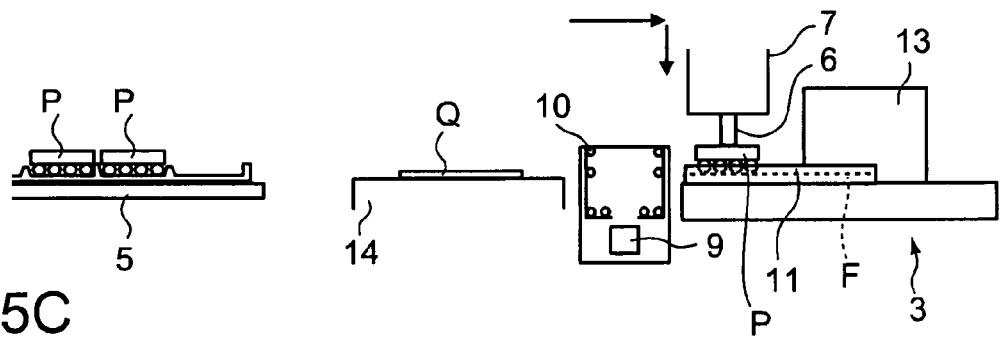
FIG.5C
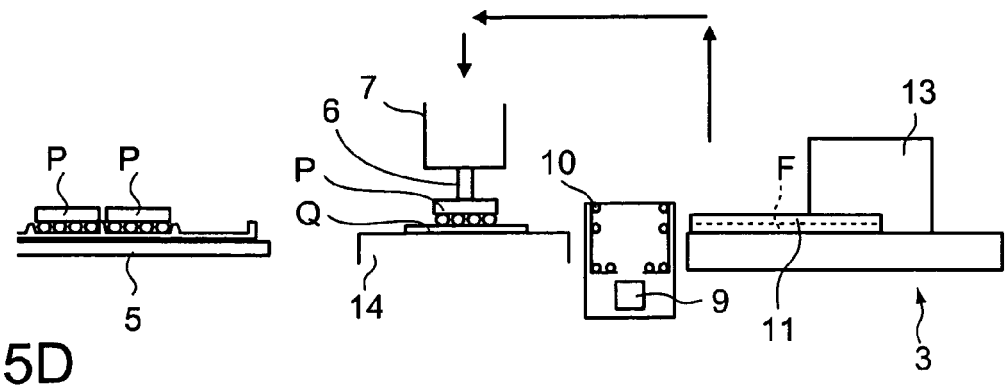
FIG.5D

FIG. 8
FIG.8A
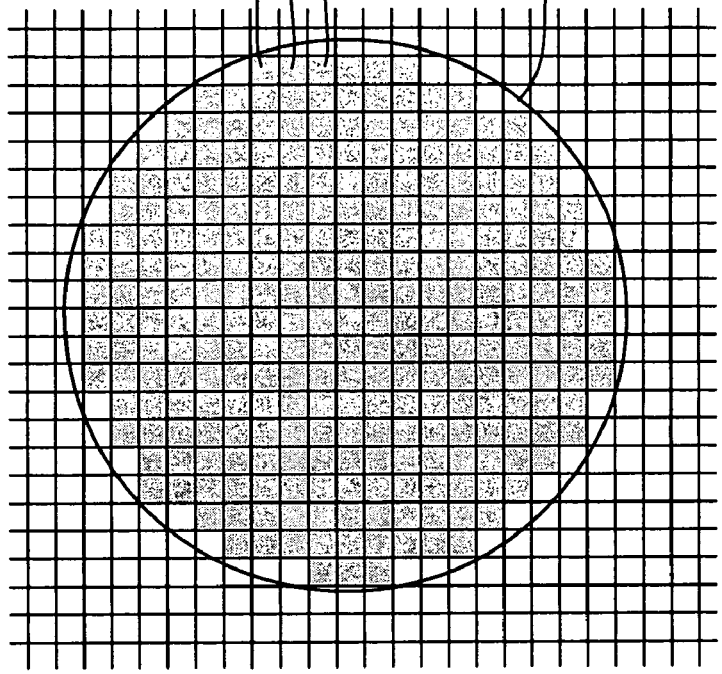
FIG.8B
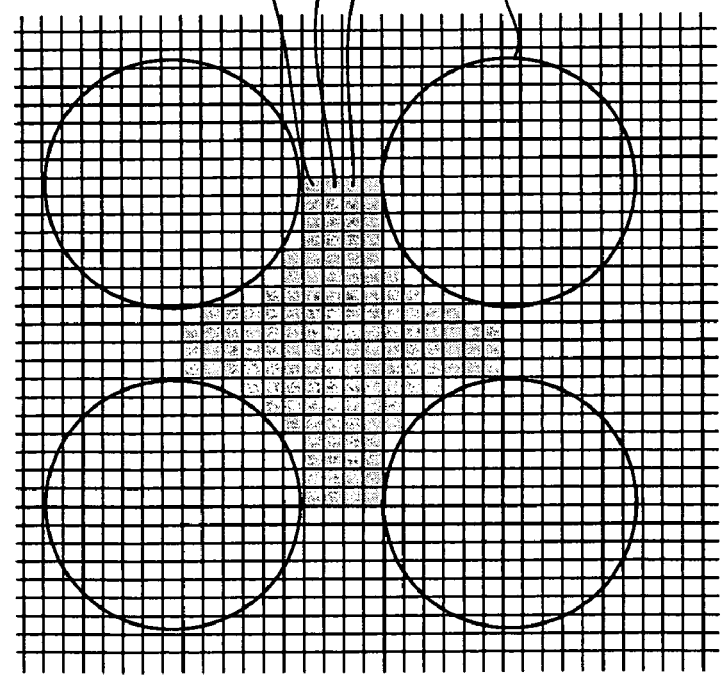

FIG. 9
FIG. 9A
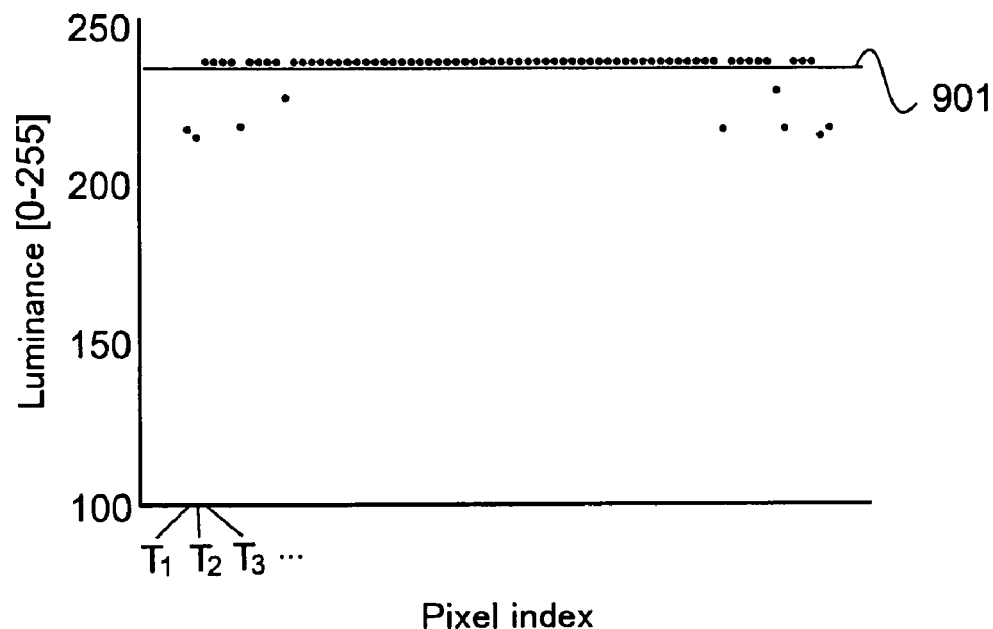
FIG. 9B
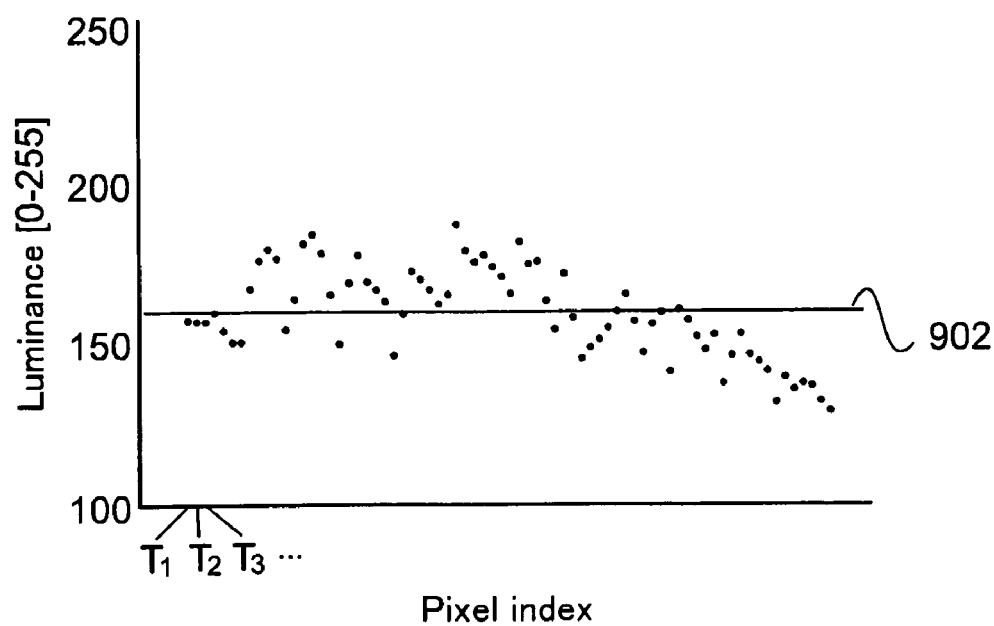

FIG. 10
FIG.10A
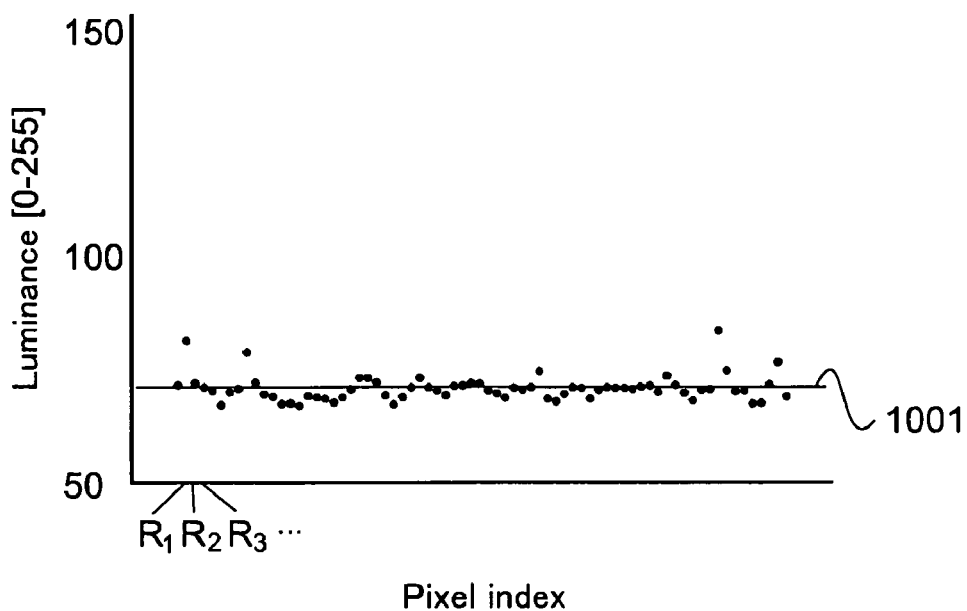
FIG.10B
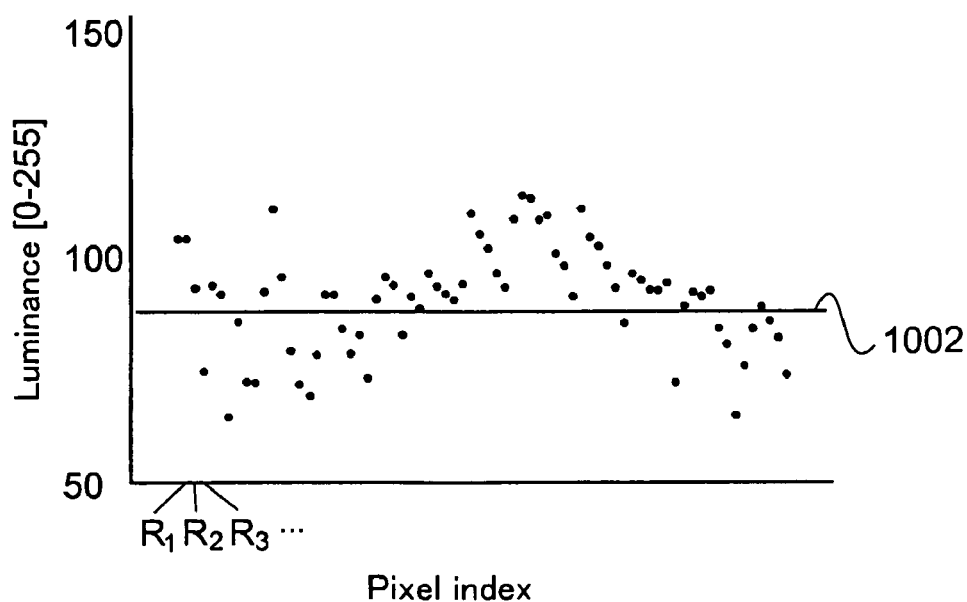

FIG. 11
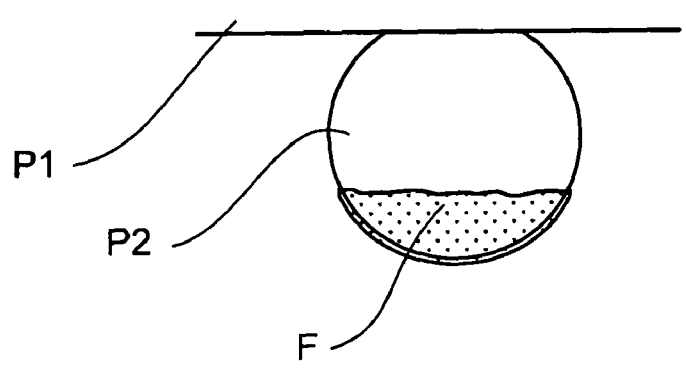
FIG.11A
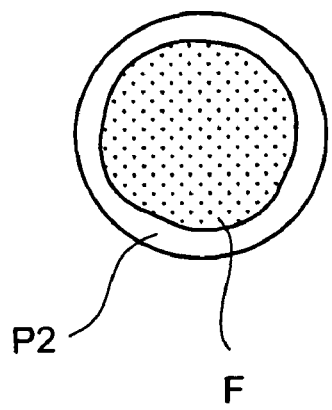
FIG.11B

FIG. 12
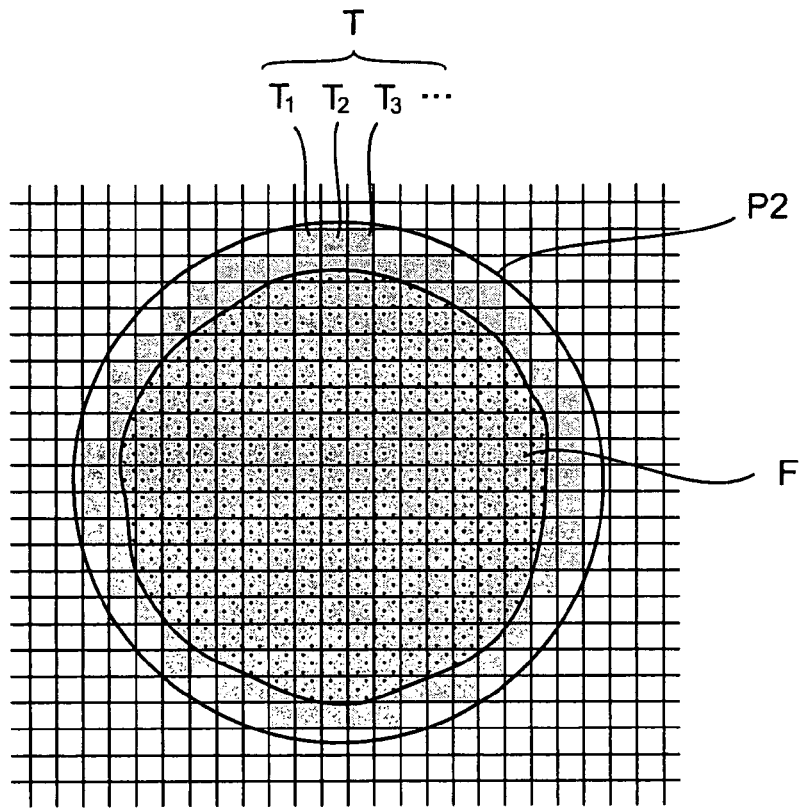
FIG. 12A
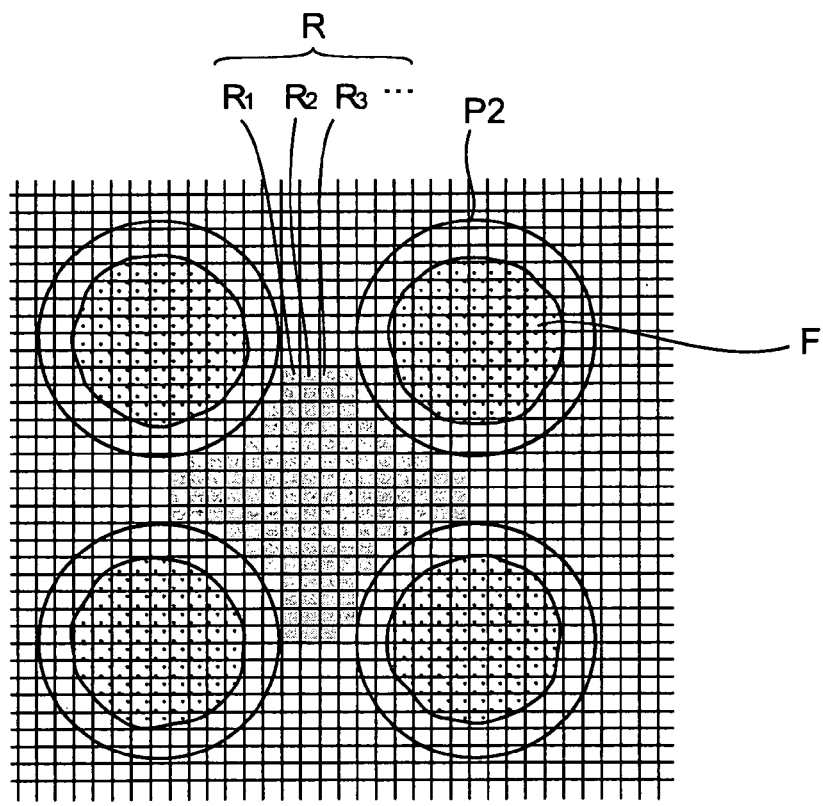
FIG. 12B

FIG. 13
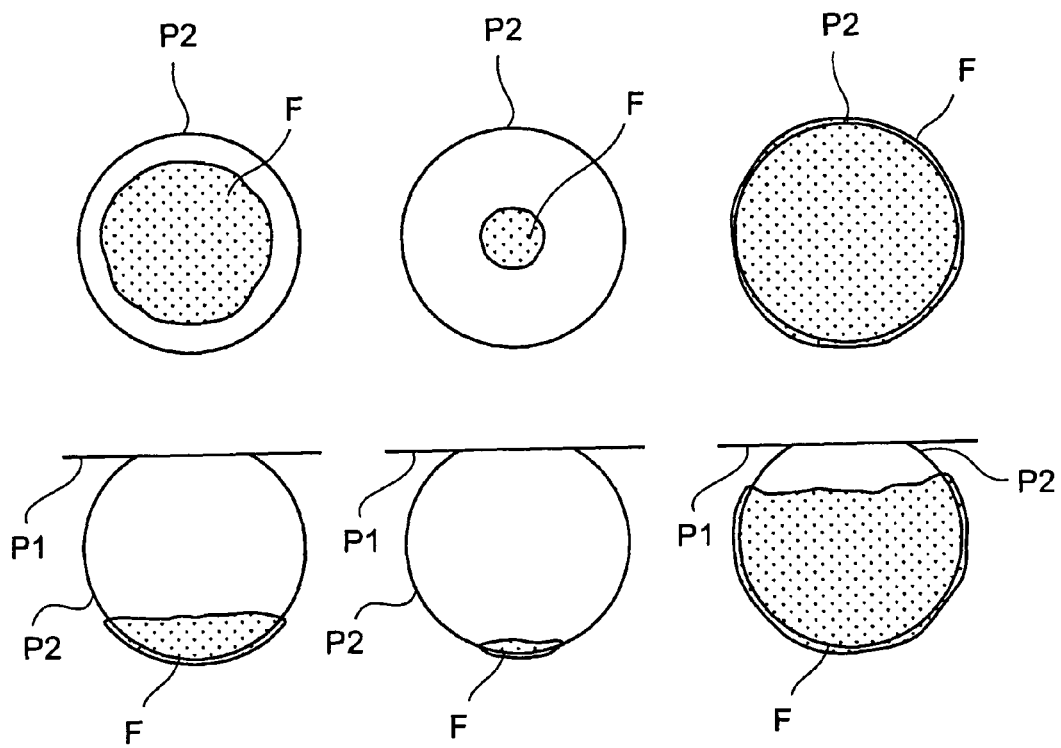
FIG.13A    FIG.13B    FIG.13C
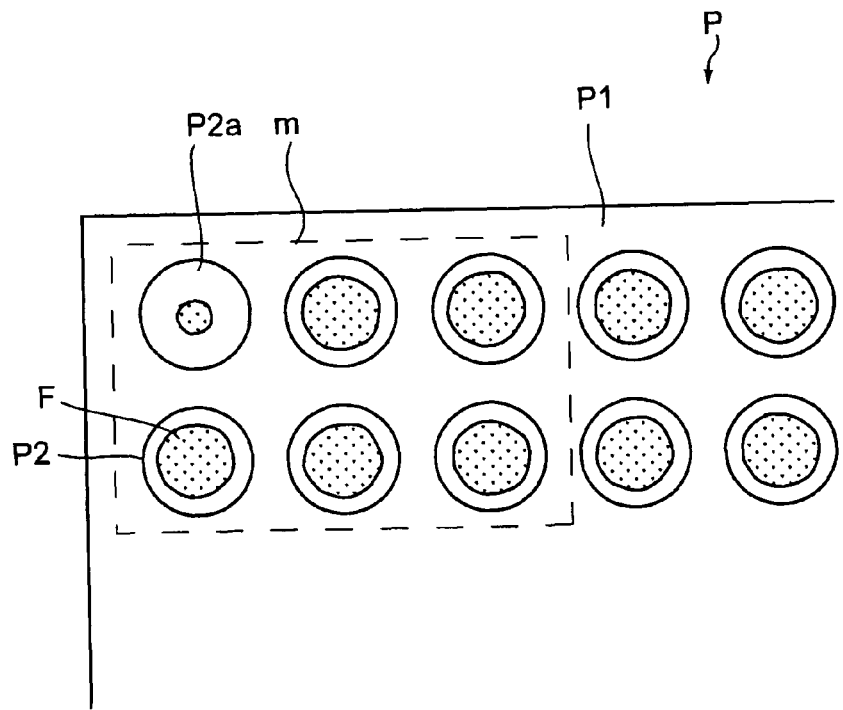
FIG.14

FIG. 15
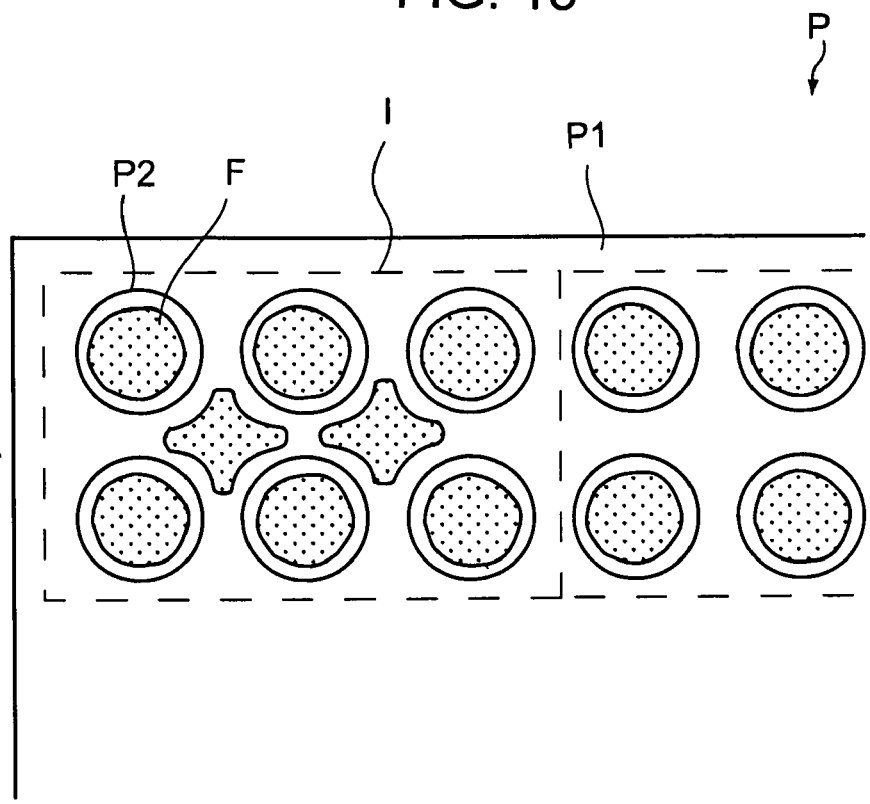
FIG.15A
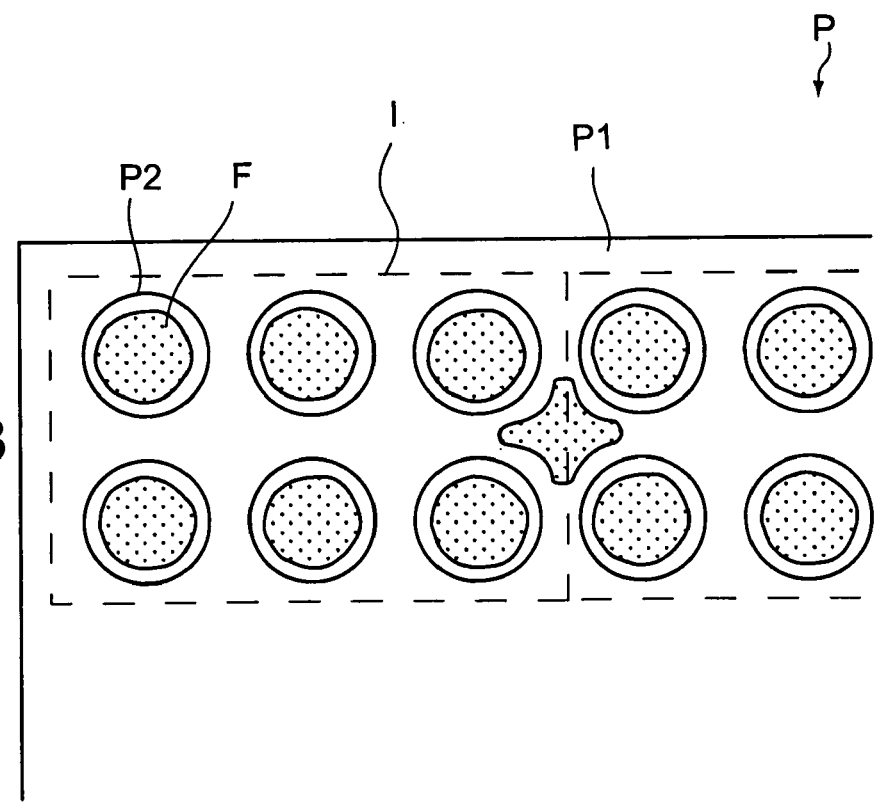
FIG.15B

FIG. 19
FIG.19A
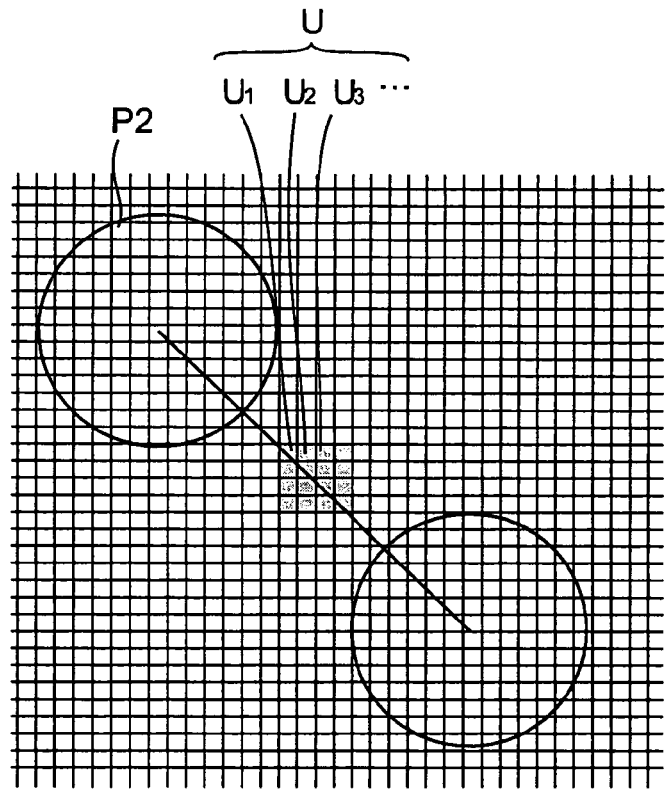
FIG.19B
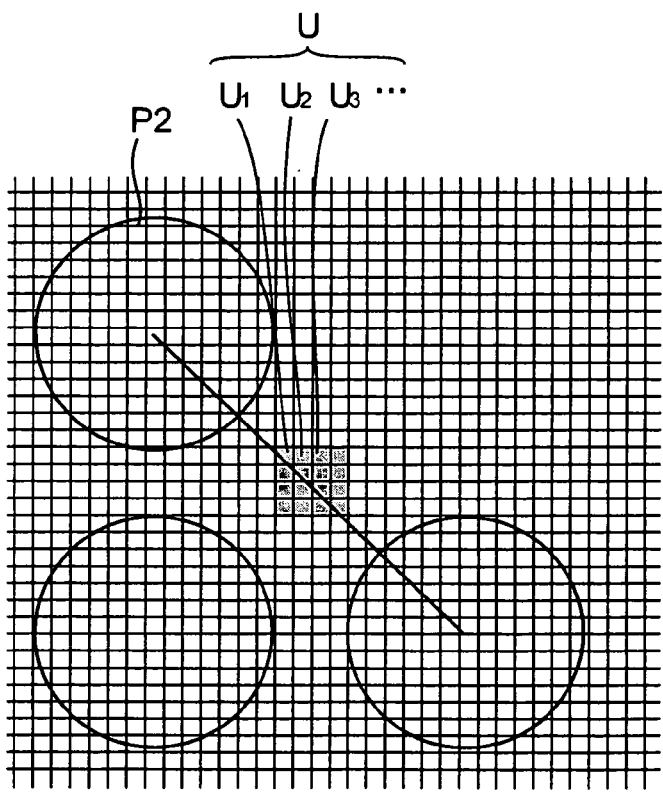

MOUNTING APPARATUS, INSPECTING APPARATUS, INSPECTING METHOD, AND MOUNTING METHOD

BACKGROUND OF THE INVENTION

1. Field of the Invention

The present invention relates to an inspecting apparatus for inspecting a coating state of a coating agent such as a soldering paste applied to an electronic circuit including an IC (Integrated Circuit) and an electronic component obtained by packaging the electronic circuit, a mounting apparatus equipped with the inspecting apparatus, an inspecting method therefor, and a method of mounting an electronic component using the inspecting method.

2. Description of the Related Art

In a production process of electronic components, a surface mounting method is used as one type of a method of mounting an electronic component. In the surface mounting method, an electronic component is connected to a substrate and the like via bumps (protrusions for electrical connection) provided on a package body thereof, for example. Here, because the bumps are coated with a coating agent such as a soldering paste, it is necessary to precisely control a coating state (coating amount or range) of the coating agent with respect to the bumps. This is because, when the surface mounting component is joined to the substrate and the like, an excessively-large amount of soldering paste causes a bridge and an excessively-small amount of soldering paste causes a connection failure.

Japanese Patent Application Laid-open No. 2006-19380 (paragraph [0040]) (hereinafter, referred to as Patent Document 1) discloses an apparatus for coating bumps with a coating agent, inspecting a coating state of the coating agent, and mounting a circuit device on a substrate. In the apparatus disclosed in Patent Document 1, a liquid agent such as the coating agent is transferred onto a bump of an electronic component by a liquid agent transfer apparatus, and the bump onto which the liquid agent has been transferred is imaged by an imaging apparatus. A distribution modal luminance (luminance with the most pixels at the same luminance) for each unit section is acquired from the image obtained by the imaging, and by comparing the acquired distribution modal luminance with that acquired by previously measuring a sample (circuit device judged that a liquid agent transfer amount thereof is adequate), it is judged whether the liquid agent transfer amount is adequate.

SUMMARY OF THE INVENTION

In the apparatus disclosed in Patent Document 1, however, an operation of measuring the distribution modal luminance of the sample needs to be carried out every time the circuit device or the substrate, or a structure of the liquid agent or the like changes. Moreover, even with the same structure, there are cases where, due to individual differences caused by differences in production conditions of the circuit device, or differences in imaging conditions in the inspection and the like, luminance of the circuit device for the inspection before being coated with the liquid agent differs from luminance of the sample before being coated with the liquid agent. Because the inspection is carried out under a presupposition that the circuit device and the sample before being coated with the liquid agent have the same luminance, there is a fear that the judgment on adequateness of the liquid agent transfer amount may not be carried out correctly.

In view of the circumstances as described above, it is desirable to provide a technique of inspecting a coating state of a coating agent having high robustness, that is, stableness with respect to uncertain factors such as individual difference of circuit devices etc. and inspection conditions.

According to an embodiment of the present invention, there is provided a mounting apparatus including a coating unit, an acquiring means, a judging means, and a mounting mechanism. The coating unit coats a first region of a coating target component as a coating target region with a coating agent. The acquiring means acquires first luminance information of the first region before being coated by the coating unit and second luminance information of the first region after being coated by the coating unit. The judging means judges a quality of a coating state of the coating agent in the first region by comparing the first luminance information and the second luminance information. The mounting mechanism mounts, on a mounting target object, the coating target component judged by the judging means that the coating state in the first region is favorable.

With this structure, the quality of the coating state of the coating agent is judged by comparing the pieces of luminance information of the same coating target component before and after the coating. Accordingly, it becomes unnecessary to additionally create and measure a sample, and influences of the individual difference of the coating target components and inspection conditions can be removed, thus making it possible to carry out the inspection with more accuracy. Due to the inspection, the coating target component in the favorable coating state can be mounted on the mounting target object.

The acquiring means may additionally acquire third luminance information of a second region of the coating target component before being coated by the coating unit, the second region being a coating-inhibited region other than the first region, and fourth luminance information of the second region after being coated by the coating unit. The judging means may additionally judge whether there is an erroneous coating in the second region by comparing the third luminance information and the fourth luminance information. The mounting mechanism may mount the coating target component judged by the judging means that the coating state of the coating agent in the first region is favorable and there is no erroneous coating in the second region.

With this structure, it is possible to judge whether the region other than the coating target region of the coating target component, that is, the coating-inhibited region is erroneously coated with the coating agent. In acquiring the luminance information of the coating target region before and after the coating described above, the pieces of luminance information of the coating-inhibited region are also acquired and compared, thus enabling the judgment to be made based on the comparison. By mounting the coating target component judged as having no erroneous coating in the coating-inhibited region, it is possible to prevent the coating target component in which the coating state of the coating target region is favorable but the coating-inhibited region is erroneously coated with the coating agent, from being mounted.

The coating target component may be a circuit device, and the first region may be constituted of a plurality of bumps provided to the circuit device.

The bumps of the circuit device are generally extremely small and arranged close to one another, and the coating state of the coating agent largely affects an electrical junction between the circuit device and the mounting target object. Therefore, whether the coating with the coating agent is performed accurately needs to be inspected minutely. The coating state of the coating agent with respect to the bumps can be inspected based on an optical reflectance of the bumps and the coating agent, that is, a luminance difference.

The acquiring means may acquire the first luminance information and the second luminance information for each of the plurality of bumps, and the judging means may judge the quality of the coating state in the first region by comparing the first luminance information and the second luminance information for each of the plurality of bumps.

Each of the plurality of bumps needs to be accurately coated with the coating agent. The coating state of the coating agent with respect to the bumps can be inspected by acquiring the pieces of luminance information for each bump and comparing them.

The acquiring means may be an imaging mechanism to acquire one of position information of the coating target component and information on whether the coating target component is adaptable.

With this structure, the luminance information is acquired by the imaging mechanism included in the mounting apparatus. The mounting apparatus according to the embodiment of the present invention includes the imaging mechanism for acquiring the position information or the information on the adaptability of the coating target component, but by using the imaging mechanism for acquiring the luminance information, it becomes unnecessary to additionally provide an apparatus, a mechanism, or the like for the inspection of the coating state.

The coating unit may include a plate to accommodate the coating agent, and the mounting apparatus may further include a detecting means for detecting an amount of the coating agent accommodated on the plate by the comparison by the judging means.

With this structure, the amount of the coating agent accommodated on the plate can be detected based on the luminance information of the coating target region of the coating target component before and after the coating described above. While the coating target region of the coating target component is coated with the coating agent when the region is immersed in the plate, the coating state in the coating target region is affected by the amount of the coating agent accommodated on the plate. Specifically, by acquiring and comparing the pieces of luminance information before and after the coating, the amount of the coating agent accommodated on the plate can be detected. Further, because the detection of the coating agent amount can be realized by the judgment processing using the luminance information, an additional sensor or the like for detecting a remaining amount of the coating agent does not need to be provided, thus realizing low cost, which is economical.

The coating unit includes an adjusting means for adjusting, based on the amount of the coating agent detected by the detecting means, the amount of the coating agent on the plate.

With this structure, it becomes possible to automatically adjust the coating agent to an amount optimal for the coating in the coating unit including the function of adjusting the amount of the coating agent accommodated on the plate.

According to another embodiment of the present invention, there is provided an inspecting apparatus inspecting a coating state of a coating agent in a coating target region of a coating target component, including an acquiring means and a judging means. The acquiring means acquires first luminance information of the coating target region before being coated with the coating agent and second luminance information of the coating target region after being coated with the coating agent. The judging means judges a quality of the coating state of the coating agent in the coating target region by comparing the first luminance information and the second luminance information.

With this structure, the quality of the coating state of the coating agent is judged based on the comparison of the pieces of luminance information of the same coating target component before and after the coating. Accordingly, it becomes unnecessary to additionally create and measure a sample, and influences of the individual difference of the coating target components and external conditions for the inspection can be removed, thus making it possible to carry out the inspection with more accuracy.

According to another embodiment of the present invention, there is provided a mounting method including: acquiring first luminance information of a coating target region of a coating target component; coating, after acquiring the first luminance information, the coating target region with a coating agent; acquiring second luminance information of the coating target region after being coated with the coating agent; judging a quality of a coating state of the coating agent in the coating target region by comparing the first luminance information and the second luminance information; and mounting, on a mounting target object, the coating target component judged that the coating state in the coating target region is favorable.

By this method, by acquiring the luminance information of the coating target region of the coating target component before and after the coating target region is coated with the coating agent, it is possible to judge the quality of the coating state for each coating target component and mount on the mounting target object only the coating target component judged as having the favorable coating state.

According to another embodiment of the present invention, there is provided an inspecting method including: acquiring first luminance information of a coating target region of a coating target component before being coated with a coating agent; acquiring second luminance information of the coating target region after being coated with the coating agent; and judging a quality of a coating state of the coating agent in the coating target region by comparing the first luminance information and the second luminance information.

By this method, by acquiring the luminance information of the coating target region of the coating target component before and after the coating target region is coated with the coating agent, it is possible to judge the quality of the coating state for each coating target component.

According to another embodiment of the present invention, there is provided an inspecting apparatus inspecting a coating state of a coating agent in a coating target region of a coating target component, including an acquiring portion and a judging portion. The acquiring portion acquires first luminance information of the coating target region before being coated with the coating agent and second luminance information of the coating target region after being coated with the coating agent. The judging portion judges a quality of the coating state of the coating agent in the coating target region by comparing the first luminance information and the second luminance information.

These and other objects, features and advantages of the present invention will become more apparent in light of the following detailed description of best mode embodiments thereof, as illustrated in the accompanying drawings.

BRIEF DESCRIPTION OF DRAWINGS

FIG. 4 are diagrams showing a surface mounting component;

FIG. 5 are diagrams showing an operation of the mounting apparatus;

FIG. 8 are partially-enlarged diagrams of the image obtained by imaging the mounting surface of the surface mounting component;

FIG. 9 are graphs in which luminance of pixels on a bump is plotted;

FIG. 10 are graphs in which luminance of pixels on a specified region is plotted;

FIG. 11 are diagrams showing a bump of the surface mounting component coated with a coating agent;

FIG. 12 are partially-enlarged diagrams of an image obtained by imaging the mounting surface of the surface mounting component coated with the coating agent;

FIG. 13 are diagrams showing bumps coated with different amounts of coating agent;

FIG. 14 is a diagram showing the mounting surface of the surface mounting component on which the bumps are coated with the coating agent;

FIG. 15 are diagrams showing the mounting surface of the surface mounting component on which a coating-inhibited region is erroneously coated with the coating agent;

FIG. 19 are diagrams showing a method of recognizing a specified region.

DESCRIPTION OF PREFERRED EMBODIMENTS

Hereinafter, embodiments of the present invention will be described with reference to the drawings.

Figure 1:
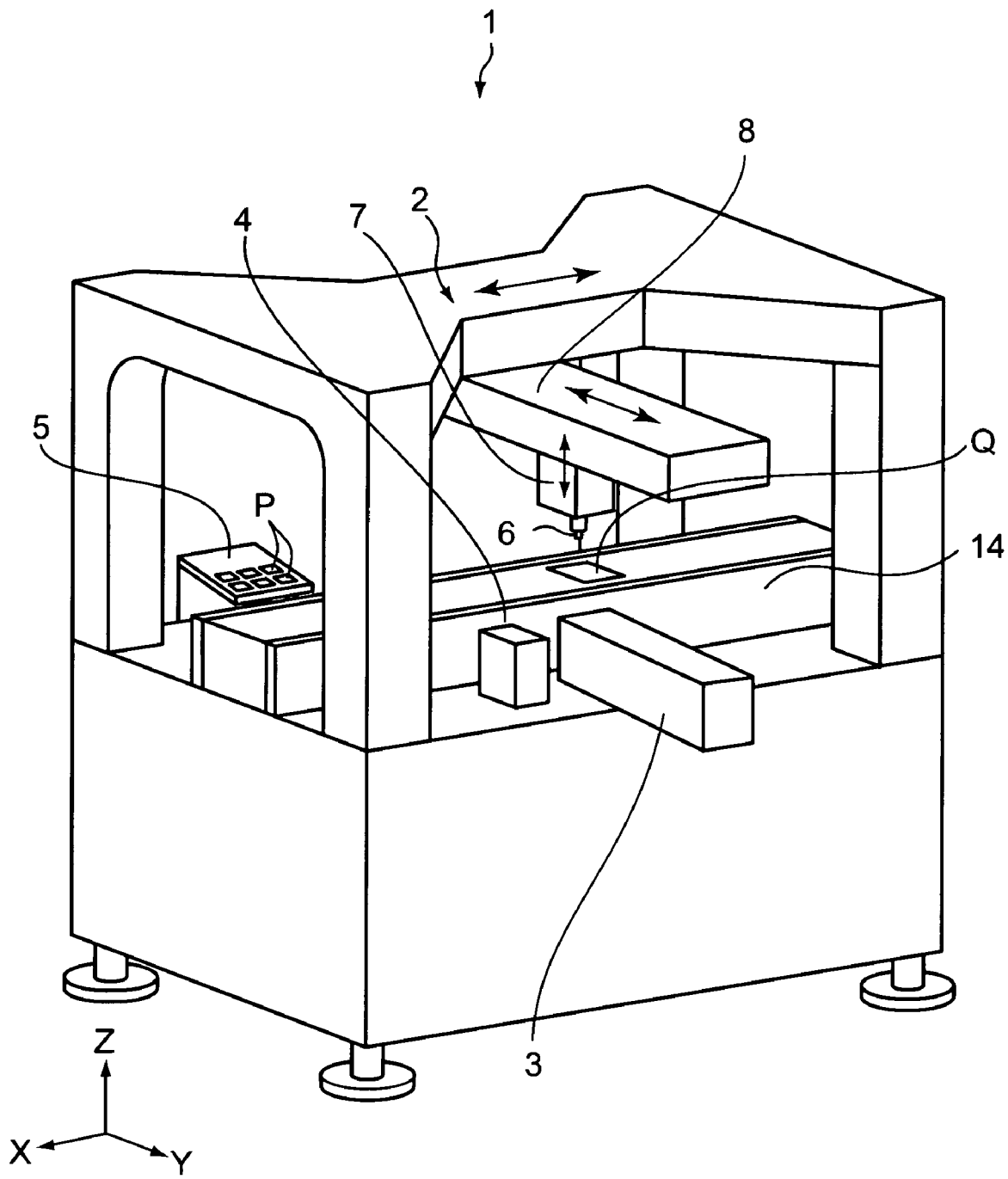
FIG. 1 is a perspective diagram showing a mounting apparatus according to an embodiment of the present invention.

FIG. 1 is a perspective diagram showing a mounting apparatus according to an embodiment of the present invention.

A mounting apparatus 1 is an apparatus that mounts, on a printed-wiring substrate Q as a mounting target object, a surface mounting component P as a coating target component. The surface mounting component P includes a predetermined surface on a side thereof that is mounted on the printed-wiring substrate Q (hereinafter, referred to as mounting surface), and the mounting surface includes a coating target region that is coated with a coating agent F such as a soldering paste (see, for example, FIGS. 11A and 11B). The surface mounting component P is an electronic component produced so as to be capable of being mounted on a surface of the printed-wiring substrate Q by soldering. The surface mounting component P typically includes a packaged circuit device. The mounting apparatus 1 is an apparatus that laminates the packaged electronic components by soldering, that is, an apparatus capable of realizing PoP (Package on Package).

The components subjected to mounting processing by the mounting apparatus 1 are bonded by thermocompression or the like using another apparatus.

As shown in FIG. 1, the mounting apparatus 1 includes a mounting mechanism 2, a coating-agent coating unit 3, an imaging mechanism 4, a component tray 5, and a substrate conveying mechanism 14.

The surface mounting components P are accommodated while being arranged longitudinally and laterally on the component tray 5 of the mounting apparatus 1, and the printed-wiring substrate Q is placed on the substrate conveying mechanism 14 such as a belt conveyor in the mounting apparatus 1.

The mounting mechanism 2 is a mechanism for moving the surface mounting component P on the component tray 5 while holding it and placing it at a predetermined position on the printed-wiring substrate Q. For example, the mounting mechanism 2 includes a suction nozzle 6 for holding the surface mounting component P, a head 7 for supporting the suction nozzle 6, and a head moving mechanism 8 for moving the head 7 in triaxial directions (X, Y, and Z axes). The suction nozzle 6 holds the surface mounting component P by vacuum suction using a vacuum generating source (not shown). It should be noted that the method of holding the surface mounting component P is not limited to the vacuum suction, and a mechanical grip, for example, may be used instead. The head moving mechanism 8 is driven by, for example, a ball screw drive method, a belt drive method, or a linear motor drive method.

The imaging mechanism 4 is a mechanism for imaging the mounting surface of the surface mounting component P absorbed by the suction nozzle 6, and functions as an acquiring means in the mounting apparatus 1 of this embodiment.

Figure 2:
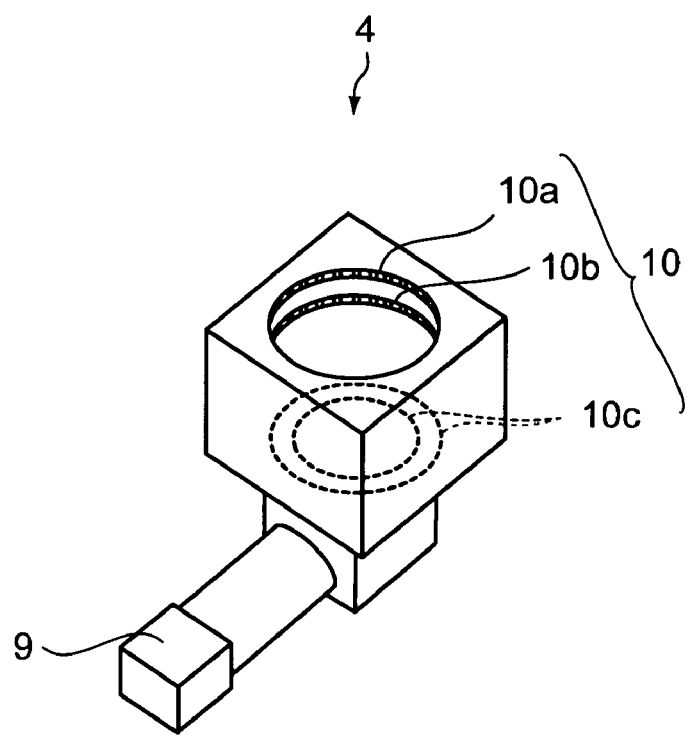
FIG. 2 is a perspective diagram showing an imaging mechanism.

FIG. 2 is a perspective diagram showing the imaging mechanism 4. The imaging mechanism 4 includes an imaging element 9 and an illumination 10. Examples of the imaging element 9 include a CCD (Charge Coupled Device), a CMOS (Complementary Metal-Oxide Semiconductor), and the like. The larger the number of pixels of the imaging element 9 is, the higher the accuracy becomes in an inspection of a coating state of the coating agent F. In the mounting apparatus 1 of this embodiment, a 2D monochrome CCD of 800,000 pixels is used as the imaging element 9. The illumination 10 is constituted of an upper-layer illumination 10a, a mid-layer illumination 10b, and a lower-layer illumination 10c that are disposed so that light is irradiated uniformly onto an imaging target (surface mounting component P). It should be noted that the imaging mechanism 4 typically includes an optical system constituted of a lens, a mirror, and the like. Although illustrated only on the front side of the substrate conveying mechanism 14 in FIG. 1, the imaging mechanism 4 is sometimes disposed on both the front and back sides of the substrate conveying mechanism 14.

The coating-agent coating unit 3 is a unit for coating the coating target region of the surface mounting component P held by the mounting mechanism 2, with the coating agent F.

Figure 3:
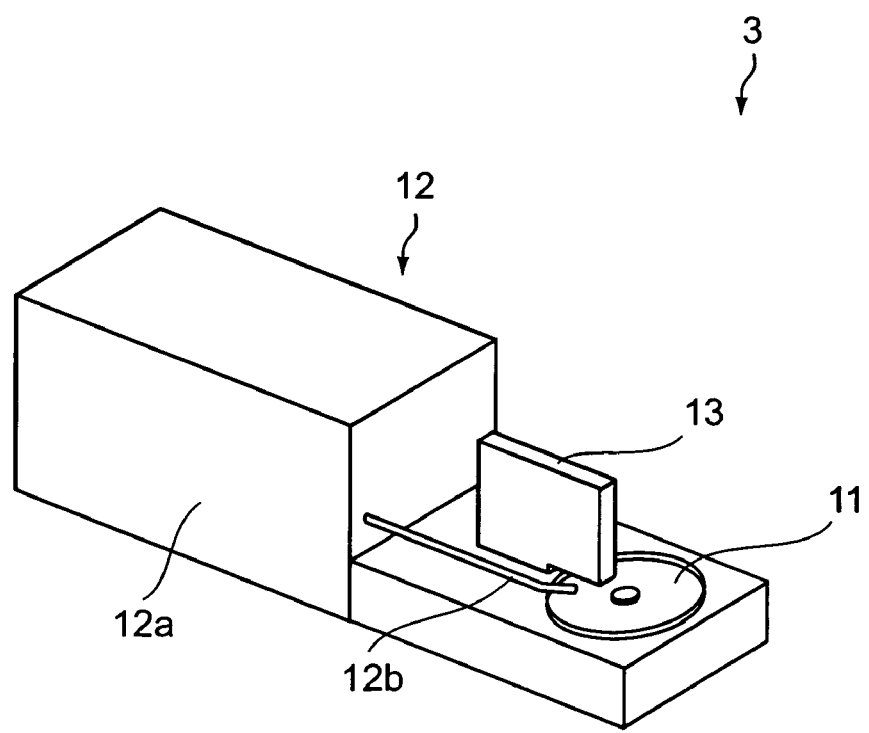
FIG. 3 is a perspective diagram showing a coating-agent coating unit.

FIG. 3 is a perspective diagram schematically showing the coating-agent coating unit 3. The coating-agent coating unit 3 includes a plate 11, a supplying portion 12, and a squeegee portion 13. The plate 11 accommodates the coating agent F supplied from the supplying portion 12 and is rotated by a motor (not shown). The squeegee portion 13 smoothens the coating agent F accommodated on the rotating plate 11. By the rotation of the plate 11, the coating agent F enters a gap between a lower portion of the squeegee portion 13 and the plate 11 so as to be smoothened. Although descriptions will be given later, by immersing the coating target region of the surface mounting component P in the smoothened coating agent F, the region is coated with the coating agent F. It should be noted that as long as the coating-agent coating unit can coat the coating target region of the surface mounting component P with the coating agent F, a different structure may be used instead.

The supplying portion 12 includes, for example, a supplying box 12a and a supplying tube 12b. An end portion of the supplying tube 12b is positioned on the plate. Inside the supplying box 12a, a supplying tank (not shown) that stores the coating agent F is provided, for example, and the coating agent F is pumped through the supplying tube 12b by a pump or the like (not shown).

The mounting apparatus 1 of this embodiment includes a controller (not shown). The controller is connected to the mounting mechanism 2, the imaging mechanism 4, and the coating-agent coating unit 3 and controls them. The controller includes a structure that enables information processing to be carried out, such as a CPU (Central Processing Unit), a ROM (Read Only Memory), and a RAM (Random Access Memory). Typically, the ROM or other storage devices stores/store predetermined programs. The predetermined programs are, as will be described later, an image processing program used for processing an image obtained through the imaging by the imaging mechanism 4, a program for judging a coating state of the coating agent F, and the like. Instead of software, hardware may be used as a structure for realizing the function of processing an image and the function of judging the coating state. Instead of the CPU, a DSP (Digital Signal Processor), an FPGA (Field Programmable Gate Array), an ASIC (Application Specific Integrated Circuit), or the like may be used.

The surface mounting component P as the coating target component will now be described.

FIG. 4 are diagrams showing the surface mounting component P. FIG. 4A is a side view of the surface mounting component P and FIG. 4B is a plan view of the mounting surface of the surface mounting component P that includes the coating target region. The surface mounting component P of this embodiment is constituted of a package body P1 and bumps P2.

The package body P1 is, for example, a circuit device such as an IC, and requires an electrical connection with an external circuit. The bumps P2 are a plurality of ball-like electrodes each formed of solder or metal and arranged on a mounting surface of the package body P1. By joining the bumps P2 to a predetermined position on the printed-wiring substrate Q, the package body P1 is electrically connected with the printed-wiring substrate Q.

The coating target region of this embodiment corresponds to a surface of each of the bumps P2. The bumps P2 coated with the coating agent F such as a soldering paste are first brought into contact with wiring of the printed-wiring substrate Q and are heated and pressurized thereafter, whereby the bumps P2 and the wiring are electrically and physically joined. Therefore, each of the bumps P2 needs to be coated with a predetermined amount of coating agent F.

Further, a coating-inhibited region corresponds to a region between the bumps P2 on the mounting surface of the package body P1. When the coating-inhibited region is erroneously coated with the coating agent F, a short circuit (bridge) occurs between the bumps.

An operation of the mounting apparatus 1 structured as described above will be described.

Figure 6:
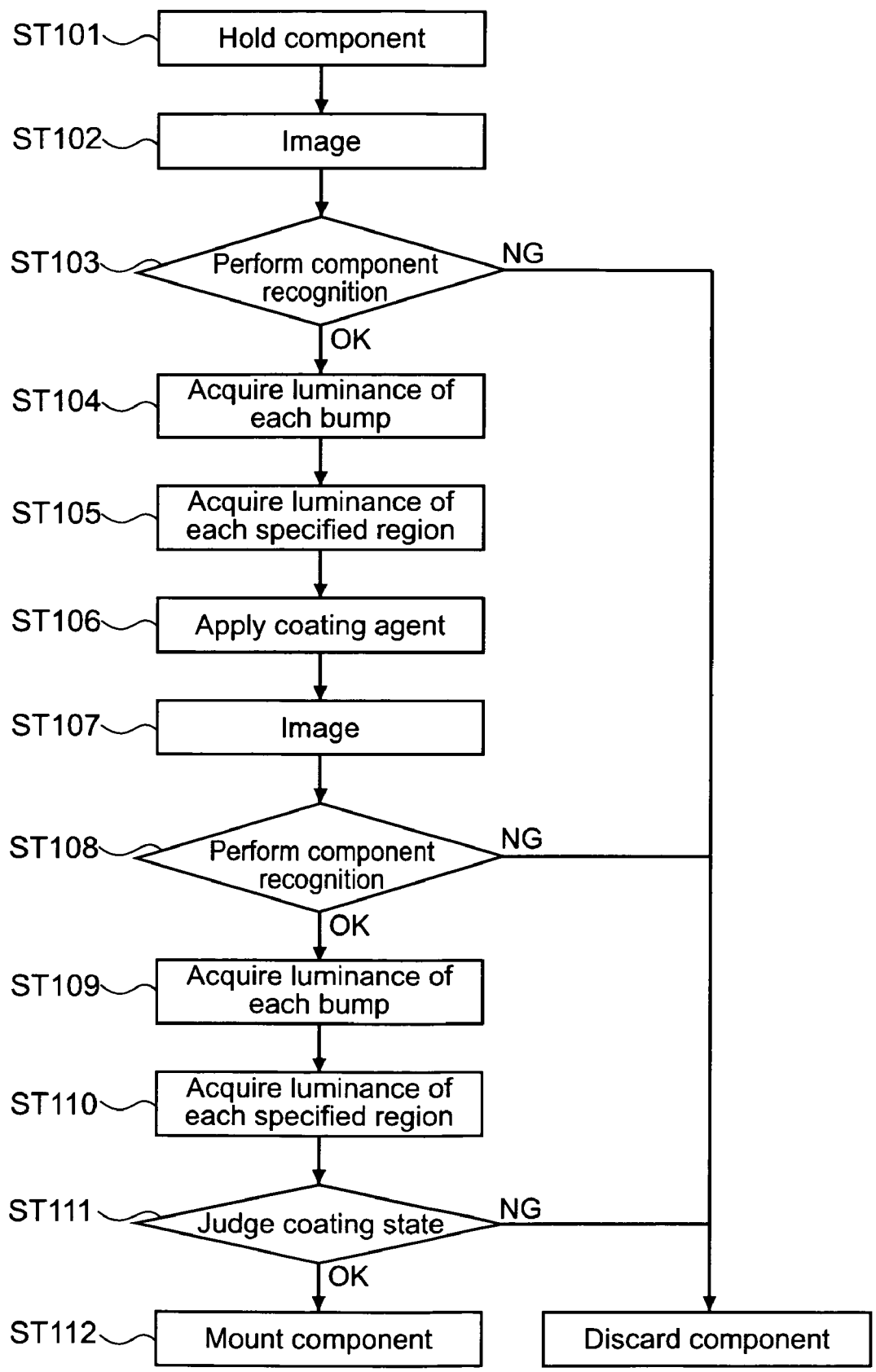
FIG. 6 is a flowchart showing the operation of the mounting apparatus.

FIG. 5 are diagrams showing the operation of the mounting apparatus 1, and FIG. 6 is a flowchart showing the operation of the mounting apparatus 1.

As shown in FIG. 1, prior to a start of a mounting operation, the surface mounting component P is accommodated on the component tray 5 (with the mounting surface thereof facing the component tray 5), and the printed-wiring substrate Q is placed on the substrate conveying mechanism 14. In addition, the smoothened coating agent F is accommodated on the plate 11 of the coating-agent coating unit 3.

Upon start of the mounting operation, the head moving mechanism 8 is driven to thus move the head 7 under control of the controller, and the suction nozzle 6 is brought close to the surface mounting component P accommodated on the component tray 5. As shown in FIG. 5A, the suction nozzle 6 absorbs a surface of the surface mounting component P opposite to the mounting surface to hold the surface mounting component P, and takes out the surface mounting component P from the component tray 5 (Step 101).

The head moving mechanism 8 is driven so that the surface mounting component P (absorbed by the suction nozzle 6) moves to an imaging position of the imaging mechanism 4. As shown in FIG. 5B, the imaging mechanism 4 irradiates light onto the surface mounting component P by the illumination 10, to thus image the surface mounting component P (Step 102).

The controller subjects image data obtained by imaging the surface mounting component P to image processing and carries out component recognition (Step 103). In the component recognition, the controller first judges whether the imaged surface mounting component P is non-defective, that is, whether the surface mounting component P is adaptable. This is carried out by, for example, collating the data subjected to the image processing with data of a non-defective surface mounting component stored in the controller. For example, when judged that the surface mounting component P is a different type of surface mounting component P or that the surface mounting component P is a defective product that includes a broken bump, the surface mounting component P is discarded or recycled. Next, the controller recognizes position information containing positional information of the imaged surface mounting component P with respect to the suction nozzle 6 by edge detecting processing or the like. This is because, although the position of the surface mounting component P with respect to the suction nozzle 6 is determined when the surface mounting component P is absorbed by the suction nozzle 6, it is necessary to accurately grasp the position.

Then, the controller acquires, from the image data, luminance information of each of the bumps P2 of the surface mounting component P before being coated with the coating agent F (Step 104), the details of which will be described later.

Subsequently, the controller acquires, from the image data, luminance information of the coating-inhibited region (specified regions) of the surface mounting component P before being coated with the coating agent F (Step 105), the details of which will be described later.

The head moving mechanism 8 is driven to move the surface mounting component P, and the coating target region of the surface mounting component P is thus coated with the coating agent F by the coating-agent coating unit 3 (Step 106). As shown in FIG. 5C, the coating is carried out such that the coating target region of the surface mounting component P, that is, the bumps P2 are immersed in the (smoothened) coating agent F accommodated in the plate 11 of the coating-agent coating unit 3. At this time, it is necessary that only the bumps P2 be coated with the coating agent F and not the coating-inhibited region. For example, by presetting a thickness of the coating agent F accommodated in the plate to a predetermined value equal to or smaller than a height of the bumps P2, the bumps P2 are coated with a desired amount of coating agent F. For maintaining the thickness of the coating agent F in the plate to the predetermined value, a height of the squeegee portion 13 is adjusted manually or automatically in advance.

The head moving mechanism 8 is driven so that the surface mounting component P is moved to the imaging position of the imaging mechanism 4. The imaging mechanism 4 again irradiates light onto the surface mounting component P by the illumination 10 to image the surface mounting component P as shown in FIG. 5B (Step 107).

The controller again subjects the image data obtained by imaging the surface mounting component P to the image processing and carries out the component recognition (Step 108). The surface mounting component P is once moved by the head moving mechanism 8 from the imaging position of the imaging mechanism 4 as a position at which the component recognition has been carried out in Step 103, to thus be coated with the coating agent F, but is moved back to the imaging position thereafter. In other words, since the imaging position is not necessarily the same as the position at which the component recognition has been carried out in Step 103, the component recognition is carried out again (recognition of a difference between the current position and the position recognized in Step 103). Further, whether the surface mounting component P is not left on the plate 11 of the coating-agent coating unit 3 is also checked.

Then, the controller acquires, from the image data obtained by imaging the surface mounting component P, luminance information of each of the bumps P2 of the surface mounting component P after being coated with the coating agent F (Step 109), the details of which will be described later.

Next, the controller acquires, from the image data, luminance information of the coating-inhibited region (specified regions) of the surface mounting component P after being coated with the coating agent F (Step 110), the details of which will be described later.

Subsequently, the controller compares the pieces of luminance information of each of the bumps P2 respectively acquired before and after the coating with the coating agent F in Steps 104 and 109, and the pieces of luminance information of the coating-inhibited region respectively acquired before and after the coating with the coating agent F in Steps 105 and 110, to judge the coating state (Step 111), the details of which will be described later. The surface mounting component P judged as having a poor coating state is discarded or recycled.

Next, as shown in FIG. 5D, the head moving mechanism 8 is driven so that the surface mounting component P is moved and mounted at a predetermined position on the printed-wiring substrate Q (Step 112). In this case, the controller adjusts the mounting position based on the position of the surface mounting component P with respect to the suction nozzle 6, that has been recognized in Step 103.

The surface mounting component P is mounted on the printed-wiring substrate Q as described above.

Descriptions on the acquisition of the luminance information of the bumps P2 in Step 104 will be given below.

Figure 7:
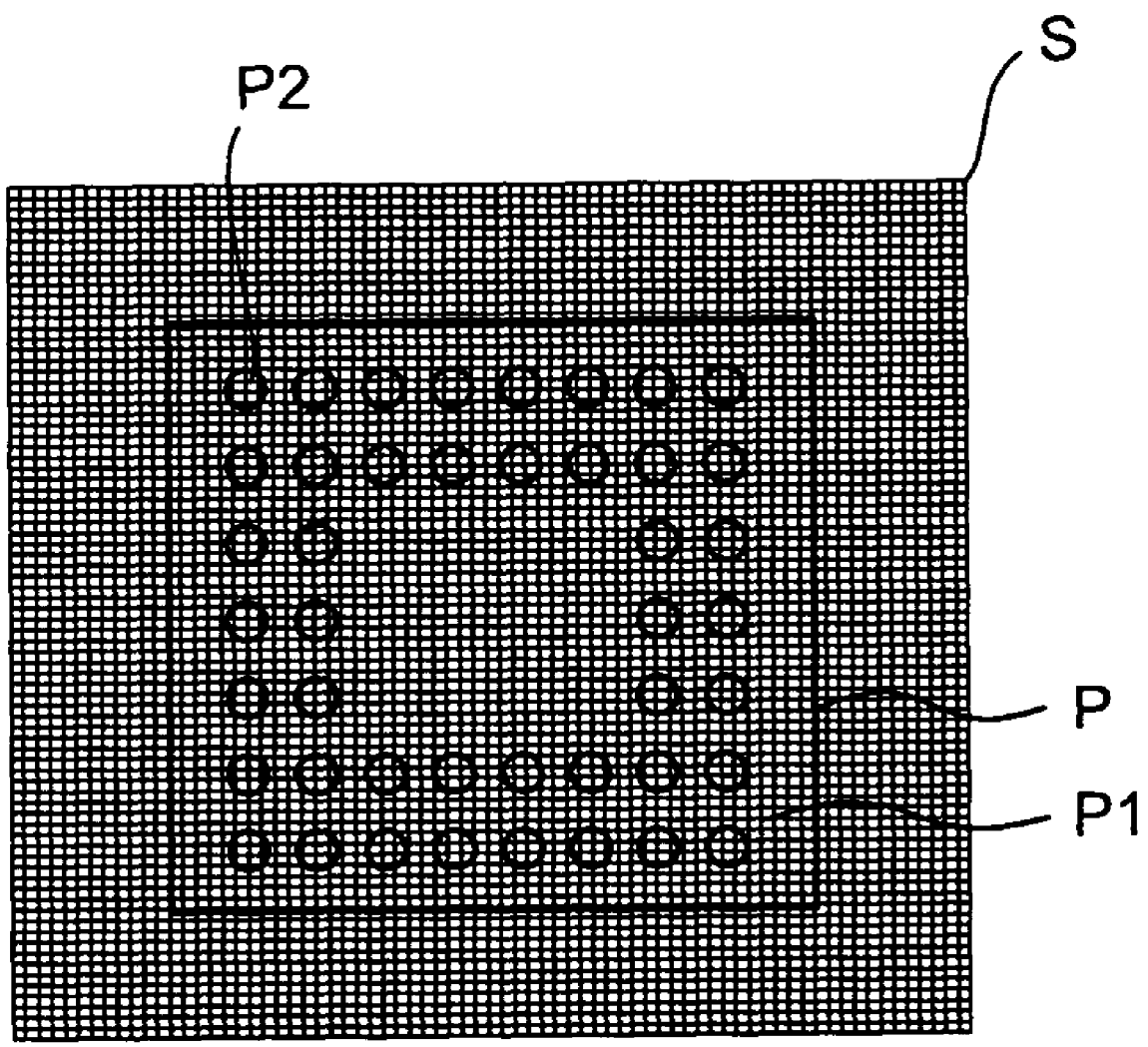
FIG. 7 is a schematic diagram showing an image obtained by imaging a mounting surface of the surface mounting component.

FIG. 7 is a schematic diagram showing an image obtained by imaging the mounting surface of the surface mounting component P. Small squares S shown in the figure each represent a pixel of the imaging element 9 of the imaging mechanism 4. In FIG. 7, each pixel is illustrated largely for ease in comprehension of the figure, but in reality, each pixel is far smaller than illustrated.

Here, since the materials of the bumps P2 and the coating-inhibited region (package body P1) differ, optical reflectance of the bumps P2 and that of the coating-inhibited region also differ. Therefore, the luminance information is affected by those materials. In the surface mounting component P of this embodiment, the optical reflectance of the bumps P2 is higher than that of the package body P1, with the result that luminance of the pixels on the bumps P2 becomes high and luminance of the pixels on the package body P1 becomes low. FIG. 9 show graphs in which the calculated luminance is plotted.

FIG. 8 are partially-enlarged diagrams of the image shown in FIG. 7 that has been obtained by imaging the mounting surface of the surface mounting component P.

FIG. 8A is an enlarged diagram centering on one bump P2. The controller recognizes, from among the plurality of pixels, a pixel group whose luminance is a threshold value or more as the bump P2. The pixels recognized by the controller as the pixels on the bump P2 are represented as small colored squares T. The controller acquires the luminance for each of the pixels represented as the small square T. It should be noted that the threshold value may be preset, or a threshold value may be calculated based on a difference between the luminance of the pixels corresponding to those on the bump P2 and the luminance of the pixels corresponding to those on the package body P1.

FIG. 9A is a graph in which the luminance of the pixels represented by small squares $T_1$, $T_2$, $T_3$, . . . on the bump P2 shown in FIG. 8A is plotted. A solid line 901 represents a mean value of the luminance (hereinafter, referred to as mean luminance value) of the pixels on the bump P2.

The mean luminance value of the bump P2 acquired as described above is stored in the controller together with coordinates of the pixels ($T_1$, $T_2$, $T_3$, . . . ) on the bump P2. The coordinates of the pixel are, for example, coordinates relative to the coordinates of the pixel including an angle of the package body P1 acquired by the edge detecting processing. The coordinates (of pixels) and the mean luminance value of all the bumps P2 are stored as described above.

Descriptions on the acquisition of the luminance information of the coating-inhibited region (specified regions) of Step 105 will be given below.

The luminance information of the coating-inhibited region is acquired simultaneously with the luminance information of the bumps P2.

FIG. 8B is an enlarged diagram centering on a gap surrounded by the bumps P2 on the mounting surface of the surface mounting component P. The controller recognizes, from among the pixels, pixels whose luminance is a threshold value or less as the pixels on the package body P1, and recognizes, from among the pixels whose luminance is the threshold value or less, pixels in the coating-inhibited region surrounded by four bumps P2 as pixels in a specified region. The pixels recognized as the specified region by the controller are represented by small colored squares R. The controller acquires the luminance for each of the pixels represented by the small squares R.

FIG. 10A is a graph in which the luminance of the pixels represented by small squares $R_1$, $R_2$, $R_3$, . . . on the specified region shown in FIG. 8B is plotted. A solid line 1001 represents a mean luminance value of the specified region.

The mean luminance value of the specified region acquired as described above is stored in the controller together with the coordinates of the pixels ($R_1$, $R_2$, $R_3$, . . . ) on the specified region. The coordinates of the pixel are coordinates relative to the coordinates of the pixel including an angle of the package body P1. The coordinates (of pixels) and the mean luminance value of all the specified regions are stored as described above.

Descriptions on the acquisition of the luminance information of the bumps P2 of Step 109 will be given below.

FIG. 11 are diagrams showing the bump P2 of the surface mounting component P coated with the coating agent F. FIG. 11A is a side view of the bump P2 seen from a direction parallel to the mounting surface, and FIG. 11B is a plan view thereof seen from a direction vertical to the mounting surface. As shown in the figures, the surface of the bump P2 is partially coated with the coating agent F.

FIG. 12 are partially-enlarged diagrams of the image obtained by imaging the mounting surface of the surface mounting component P coated with the coating agent F.

FIG. 12A is an enlarged diagram centering on the bump P2 coated with the coating agent F. The controller acquires the luminance of the pixels ($T_1, T_2, T_3, \ldots$) corresponding to the bump P2 imaged prior to the coating with the coating agent F in Step 104 as described above. Here, the coordinates of the pixels ($T_1, T_2, T_3, \ldots$) are, as described above, coordinates relative to the coordinates of the pixel including an angle of the package body P1. Therefore, even when the position of the surface mounting component P is deviated from that at the time of imaging in Step 104, the position on the surface mounting component P does not change.

FIG. 9B is a graph in which the luminance of the pixels represented by the small squares $T_1, T_2, T_3, \ldots$ on the bump P2 shown in FIG. 12A after being coated with the coating agent F is plotted. A solid line 902 represents a mean luminance value on the bump P2.

The mean luminance value of the bump P2 after being coated with the coating agent F that has been acquired as described above is stored in the controller together with the coordinates of the pixels ($T_1, T_2, T_3, \ldots$). The coordinates (of pixels) and the mean luminance value of all the bumps P2 are stored as described above.

Descriptions on the acquisition of the luminance information of the coating-inhibited region (specified regions) of Step 110 will be given below.

The luminance information of the coating-inhibited region is acquired simultaneous with the luminance information of the bumps P2 after being coated with the coating agent F.

FIG. 12B is an enlarged diagram centering on a gap surrounded by the bumps P2 coated with the coating agent F. The controller acquires the luminance of the pixels ($R_1, R_2, R_3, \ldots$) corresponding to the specified region imaged prior to the coating with the coating agent F in Step 104 as described above. Here, the coordinates of the pixels ($R_1, R_2, R_3, \ldots$) are coordinates relative to the coordinates of the pixel including an angle of the package body P1. Therefore, even when the position of the surface mounting component P is deviated from that at the time of imaging in Step 104, the position on the surface mounting component P does not change.

FIG. 10B is a graph in which the luminance of the pixels ($R_1, R_2, R_3, \ldots$) corresponding to the specified region shown in FIG. 12B after being coated with the coating agent F is plotted. A solid line 1002 represents a mean luminance value of the specified region. The coordinates (of pixels) and the mean luminance value of all the specified regions are stored as described above.

Now, descriptions on the judgment on the coating state of Step 111 will be given below.

The controller of the mounting apparatus 1 according to this embodiment compares the thus-acquired luminance information of the surface mounting component P before being coated with the coating agent F and the thus-acquired luminance information of the surface mounting component P after being coated with the coating agent F for both of the bumps P2 and the specified regions, to thus judge the coating state.

The optical reflectance of the coating agent F of this embodiment is lower than that of the bumps P2 and higher than that of the package body P1. Thus, the luminance of the bumps P2 coated with the coating agent F is lower than that of the bumps P2 not coated with the coating agent F, and the luminance of the package body P1 (erroneously) coated with the coating agent F is higher than that of the package body P1 not coated with the coating agent F. Generally, the bumps of the surface mounting component P are sufficiently small, and the thickness of the coating agent F that the bumps are coated with is also sufficiently small. Thus, the coating agent that the bumps of the surface mounting component P are coated with does not shut out light completely, meaning that the coating agent is translucent. Therefore, the luminance of the bumps P2 coated with the coating agent F is higher than that of the package body P1 coated with the coating agent F.

The comparison of the pieces of luminance information of the bumps P2 and the judgment on the coating amount of the coating agent F will be described below.

The mean luminance values for all the bumps P2 formed on the surface mounting component P, that have respectively been acquired before and after the coating with the coating agent F in Steps 104 and 109 are compared. As shown in FIGS. 9A and 9B, because the bump P2 is coated with the coating agent F, the mean luminance value thereof is lowered.

FIG. 13 show the bumps P2 coated with different amounts of coating agent F. FIG. 13A shows a bump P2 coated with an appropriate amount of coating agent F, FIG. 13B shows a bump P2 coated with an excessively-small amount of coating agent F, and FIG. 13C shows a bump P2 coated with an excessively-large amount of coating agent F.

An exposure of the material of the bump P2 coated with an excessively-small amount of coating agent F (FIG. 13B) is larger than that of the bump P2 coated with an appropriate amount of coating agent F (FIG. 13A). Therefore, the number of (low-luminance) pixels ($T_1, T_2, T_3, \ldots$) on the coating agent F (having low optical reflectance) on the bump P2 shown in FIG. 13B is small. In other words, the mean luminance value of the bump P2 shown in FIG. 13B is larger than that of the bump P2 shown in FIG. 13A. Similarly, the bump P2 coated with the excessively-large amount of coating agent F shown in FIG. 13C has a large number of low-luminance pixels, and the mean luminance value thereof is smaller than that of the bump P2 shown in FIG. 13A.

In view of the above, the controller compares the mean luminance values of the bumps P2 before and after being coated with the coating agent F. In the comparison, a difference or ratio of those two values is calculated, for example. For example, the controller can judge whether the difference or ratio of those two values falls within a numerical value range that has been preset by the user or automatically calculated, to judge whether the coating amount of the coating agent F with respect to the bump P2 is excessively small or excessively large.

The controller of the mounting apparatus 1 according to this embodiment can thus judge whether the coating amount of the coating agent F is appropriate for each of the bumps P2, thus making it possible to carry out the inspection with more accuracy.

Here, as a comparative example of this embodiment, an example of observing a predetermined region containing the plurality of bumps P2 larger than a single bump P2 without judging the coating amount of the coating agent F for each bump P2 will be described. Here, descriptions will be given assuming that the coating amount is detected based on the mean luminance values of the predetermined region. FIG. 14 exemplifies a part of the mounting surface of the surface mounting component P coated with the coating agent F. A bump P2a as one of the bumps P2 shown in FIG. 14 is coated with an excessively-small amount of coating agent F, and other bumps P2 are coated with an appropriate amount of coating agent F. In this case, a region m that is indicated by the broken line and includes the plurality of bumps P2 is assumed to be a minimum judgment target region. Specifically, when calculating the mean luminance value of the region m, there is a possibility that the fact that the coating amount of the coating agent F with respect to the bump P2a is excessively small is not detected.

In contrast, in the mounting apparatus 1 of this embodiment, the coating amount of the coating agent F with respect to the bump P2 is judged for each of the bumps P2. Therefore, it is possible to detect that the bump P2a shown in FIG. 14 is coated with an excessively-small amount of coating agent F.

The comparison of the pieces of luminance information of the specified regions of the coating-inhibited region and a judgment on presence/absence of an erroneous coating of the coating agent F will now be described.

The mean luminance values of the specified regions that have respectively been acquired before and after the coating with the coating agent F in Steps 105 and 110 are compared. As shown in FIGS. 10A and 10B, with the specified region being erroneously coated with the coating agent F, the mean luminance value thereof increases.

FIG. 15 are diagrams each showing the mounting surface of the surface mounting component P in which the coating-inhibited region is erroneously coated with the coating agent F.

Due to the coating-inhibited region being erroneously coated with the coating agent F, (high-luminance) pixels are present on the coating agent F (having high optical reflectance) on the specified region. In other words, the mean luminance value of the specified region becomes higher than that of the specified region before being erroneously coated with the coating agent F.

In view of the above, the controller compares the mean luminance values of each of the specified regions before and after the coating with the coating agent F. In the comparison, a difference between those two values is calculated, for example. For example, the controller can judge whether the difference between those two values is equal to or larger than a threshold value that has been preset by the user or automatically calculated, to judge whether the specific region has been erroneously coated with the coating agent F.

The controller of the mounting apparatus 1 according to this embodiment can thus judge whether there is an erroneous coating of the coating agent F for each of the specified regions, thus making it possible to carry out the inspection with more accuracy.

Here, an example where the presence/absence of the erroneous coating of the coating agent F is not judged for each specified region will be described. As shown in FIG. 15A, a region 1 that is indicated by the broken line and includes the plurality of bumps P2 and specified regions is assumed to be a minimum judgment target region. Specifically, in a case of calculating the mean luminance value of the region 1, there is a possibility that although it is possible to recognize the erroneous coating based on an increase in the mean luminance value when the coating agent F is present in the region 1 erroneously coated therewith, when the coating agent F crosses over a plurality of regions 1 erroneously coated therewith as shown in FIG. 15B, for example, the erroneous coating is not recognized.

In contrast, in the mounting apparatus 1 of this embodiment, the erroneous coating of the coating agent F with respect to the coating-inhibited region is judged for each of the specified regions. Therefore, it is possible to detect the presence/absence of the erroneous coating with high accuracy.

The coating amount of the coating agent F with respect to the bumps P2 and the erroneous coating of the coating agent F in the coating-inhibited region, that is, the coating state of the surface mounting component P is judged as described above.

In the mounting apparatus 1 of this embodiment, luminance information of a specific surface mounting component P before being coated with the coating agent F (reference data) is compared with luminance information of the surface mounting component P after being coated with the coating agent F as described above, whereby a change attributable to the applied coating agent F can be obtained.

Thus, a quality of the coating state of the coating agent F is judged based on the comparison between the pieces of luminance information of the same surface mounting component P before and after the coating. Accordingly, it is unnecessary to additionally create and measure a sample, and influences of the individual difference of the surface mounting components P and inspection conditions can be removed, thus making it possible to carry out the inspection with more accuracy. Due to the inspection, the surface mounting component P in the favorable coating state can be mounted on the printed-wiring substrate Q.

The influence of the individual difference of the surface mounting components P means that when a dimension, color, and the like of the surface mounting components P having the same structure vary depending on a lot, luminance thereof may also vary, so every time the luminance changes, it is necessary to recreate data of the luminance information.

The influence of inspection conditions means that when there is a change in the illumination system due to a model change and the like of the mounting apparatus 1 or the imaging mechanism 4, for example, it is necessary to recreate all the data of the luminance information.

In the mounting apparatus 1 of this embodiment, it is possible to judge whether the region other than the coating target region (bumps P2) of the surface mounting component P, that is, the coating-inhibited region is erroneously coated with the coating agent F. The judgment is made by acquiring the luminance information of the coating-inhibited region at the time of acquiring the luminance information of the bumps P2 before and after the coating, and comparing the acquired pieces of luminance information. By mounting the surface mounting component P judged as having no erroneous coating in the coating-inhibited region, it is possible to prevent the surface mounting component P in which the coating state of the bumps P2 is favorable but the coating-inhibited region is erroneously coated with the coating agent F from being mounted.

In the mounting apparatus 1 of this embodiment, generally, the bumps P2 of the surface mounting component P are extremely small and arranged close to one another, and the coating state of the coating agent F largely affects an electrical junction between the surface mounting component P and the printed-wiring substrate Q. Therefore, it is necessary to minutely inspect whether the surface mounting component P is coated with the coating agent F with accuracy. The coating state of the coating agent F with respect to the bumps P2 can be inspected based on a difference between the optical reflectance of the bumps P2 and that of the coating agent F, that is, a luminance difference.

In the mounting apparatus 1 of this embodiment, it is possible to inspect the coating state of the coating agent F with respect to the bumps P2 by acquiring the luminance information for each bump P2 and comparing the acquired pieces of luminance information.

The mounting apparatus 1 of this embodiment includes the imaging mechanism 4 for acquiring the position information and information on adaptability of the surface mounting component P. However, by using the imaging mechanism 4 for acquiring the luminance information, an apparatus, mechanism, or the like for inspecting the coating state does not need to be additionally provided.

In the mounting apparatus 1 of this embodiment, the quality of the coating state of the coating agent F is judged based on the comparison between the pieces of luminance information of the same surface mounting component P before and after the coating. Accordingly, it is unnecessary to additionally create and measure a sample, and influences of the individual difference of the surface mounting components P and external conditions in the inspection can be removed, thus making it possible to carry out the inspection with more accuracy.

Figure 18:
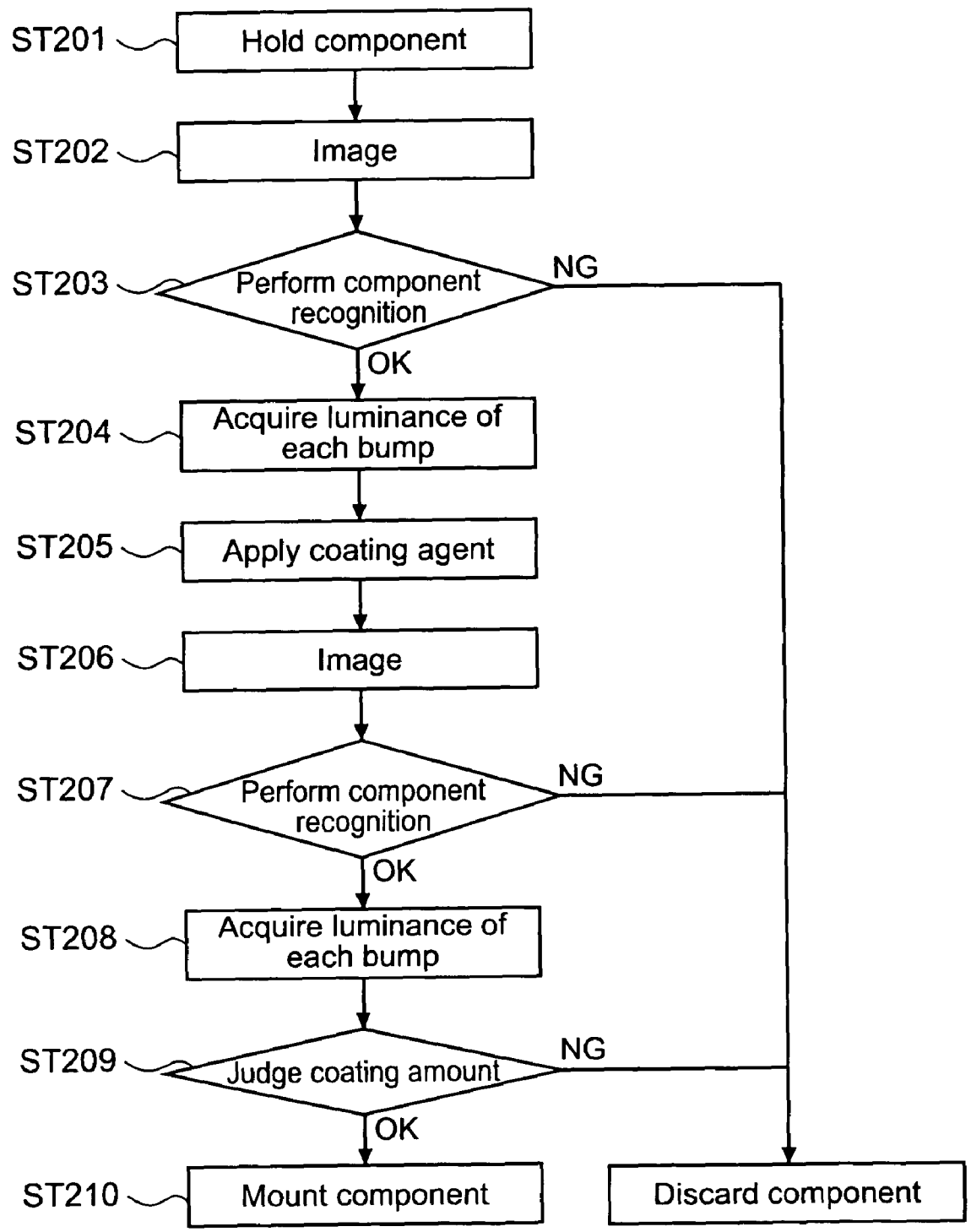
FIG. 18 is a flowchart showing an operation of a mounting apparatus according to another embodiment of the present invention.

Next, an operation of the mounting apparatus 1 according to another embodiment of the present invention will be described. FIG. 18 is a flowchart showing the operation of the mounting apparatus in a case where the presence/absence of the erroneous coating in the specified region is not judged.

As in the above embodiment, the surface mounting component P is held by the suction nozzle 6 (Step 201) and imaged by the imaging mechanism 4 (Step 202). Then, component recognition is carried out (Step 203), and luminance of each of the bumps P2 is acquired. (Step 204). The bumps P2 are then coated with the coating agent F (Step 205), and the surface mounting component P is again imaged by the imaging mechanism 4 (Step 206). Then, component recognition is carried out again (Step 207), and luminance of each of the bumps P2 is acquired (Step 208).

The pieces of luminance information of the bump P2 that have respectively been acquired before and after the coating with the coating agent F in Steps 204 and 208 are compared, to thus judge the coating amount of the coating agent F (Step 209). The surface mounting component P judged as having a favorable coating amount in Step 209 is mounted on the printed-wiring substrate Q (Step 210).

Next, another embodiment of the present invention will be described.

Hereinbelow, descriptions on structures, functions, and the like that are the same as those of the mounting apparatus of the above embodiments will be simplified or omitted, and points different therefrom will mainly be described.

In addition to the functions of the mounting apparatus 1 of the above embodiments, the mounting apparatus 1 of this embodiment includes a function of automatically supplying the coating agent F used for the coating.

Figure 16:
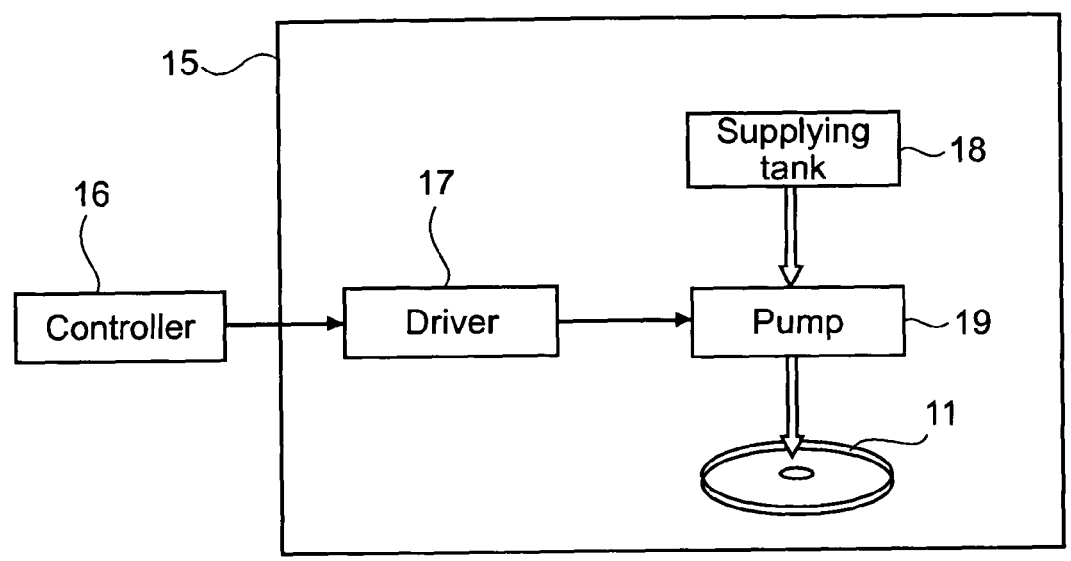
FIG. 16 is a block diagram showing an adjusting mechanism.

A coating-agent coating unit 15 of the mounting apparatus 1 according to this embodiment includes an adjusting mechanism (adjusting means) capable of adjusting a supplying amount of the coating agent F to the plate 11 from the supplying portion 12 under control of a controller 16. FIG. 16 is a block diagram showing the adjusting mechanism. The adjusting mechanism includes a pump 19 connected to a supplying tank 18 for storing the coating agent F, and a driver 17 for driving the pump 19 in response to a control signal from the controller 16. It is only necessary that a piston pump, a gear pump, a screw pump, or other pumps be used for the pump 19. Hardware, software, or a combination of those only needs to be used for the driver 17.

It is also possible for the pump 19 to supply only a preset amount of coating agent F by an ON/OFF drive signal from the driver 17, when there is only a small amount of coating agent F left in the plate 11. Alternatively, an operational amount of the pump 19 may be controlled variably based on the drive signal from the driver 17.

Next, an operation of the mounting apparatus 1 according to this embodiment will be described.

In the mounting apparatus 1 of this embodiment, it is possible to successively mount the plurality of surface mounting components P to one or a plurality of printed-wiring substrates Q. When one surface mounting component P is coated with the coating agent F by the coating-agent coating unit 15, the plate 11 of the coating-agent coating unit 15 is rotated and the coating agent F accommodated in the plate 11 is smoothened by the squeegee portion 13, thus making it possible for the next surface mounting component P to be coated with the coating agent F. By the plurality of surface mounting components P being successively coated with the coating agent F, the amount of coating agent F accommodated in the plate 11 gradually reduces.

By immersing the coating target region (bumps P2) of the surface mounting component P in the plate 11 of the coating-agent coating unit 15 of the mounting apparatus 1 of this embodiment, the surface mounting component P is coated with the coating agent F. The coating amount of the coating agent F at this time is determined based on the thickness of the coating agent F that is accommodated in the plate 11 and smoothened by the squeegee portion 13. In other words, the amount of coating agent F accommodated in the plate 11 can be derived from the coating amount of the coating agent F with respect to the bumps P2.

In Step 109 shown in the flowchart (FIG. 6) of the mounting apparatus 1 of the above embodiment, the luminance information of the bumps P2 after being coated with the coating agent F is acquired. Here, as described above, the luminance of the bumps P2 is lowered when coated with the coating agent F, but the extent to which the luminance is lowered varies depending on the coating amount. In other words, the luminance of the bumps P2 is low when the coating amount of the coating agent F is large, that is, the luminance increases as the coating amount decreases.

Figure 17:
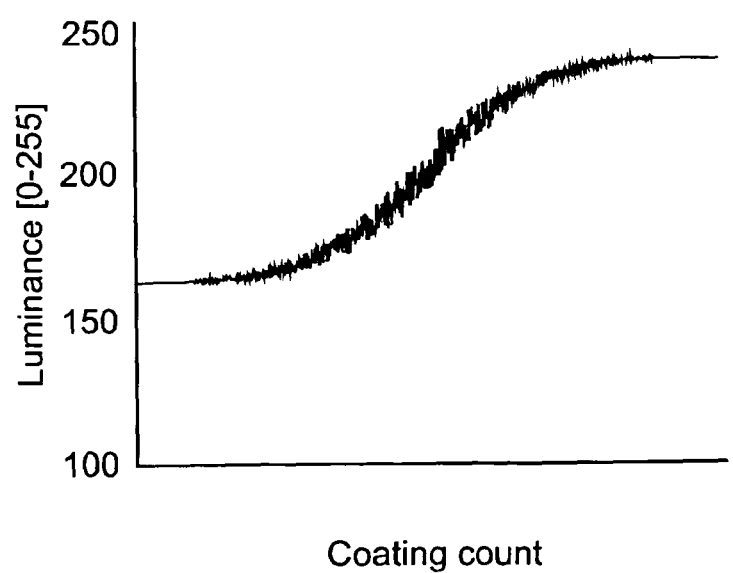
FIG. 17 is a graph in which luminance of the bump with respect to a coating count is plotted.

FIG. 17 is a graph in which the luminance of the bump P2 with respect to a coating count is plotted. The luminance of the bump P2 is an average luminance of all the bumps P2 included in a certain surface mounting component P, and the coating count is the number of surface mounting components P that have been coated. As shown in the figure, as the coating count increases, the luminance of the bump P2 increases. A relationship between the luminance and the amount of coating agent F accommodated in the plate 11 is measured in advance, and measurement data thereof is stored in the controller 16. Accordingly, the controller 16 can detect the amount of coating agent F accommodated in the plate 11 based on the acquired luminance.

Further, it is only necessary that luminance indicating a minimum amount of coating agent F necessary for the bump P2 to be coated with an appropriate amount of coating agent F accommodated in the plate 11, be set as the threshold value. Accordingly, the controller 16 can output a signal instructing the driver 17 of the coating-agent coating unit 15 to supply the coating agent F in accordance with a reduction in the amount of coating agent F accommodated in the plate 11, and adjust the supplying amount of the coating agent F with respect to the plate 11 from the supplying portion 12 of the coating-agent coating unit 15. In other words, the amount of coating agent F accommodated in the plate 11 can automatically be adjusted to an amount optimum for the coating.

It should be noted that without being limited to the automatic supply, the controller 16 may alternatively notify the user that the coating agent F needs to be supplied, in accordance with the reduction in the amount of coating agent F.

In the mounting apparatus 1 of this embodiment, the residual amount of the coating agent F is detected by the image processing. Therefore, it is unnecessary to additionally provide a sensor or the like for detecting the residual amount of the coating agent F, thus realizing low cost, which is economical.

The embodiment of the present invention is not limited to the above embodiments, and various other embodiments can also be employed.

In the above embodiments, the component recognition and various operations for acquiring the luminance are carried out by the imaging mechanism 4, though not limited thereto. For example, it is also possible that the component recognition is carried out by a recognizing mechanism other than the imaging mechanism, such as an optical sensor, for recognizing a position recognizing mark provided at a predetermined position on the surface mounting component P, and the luminance acquisition is carried out by the imaging mechanism.

In the above embodiments, the coating state of the coating agent F is judged by comparing the mean luminance values of each of the bumps P2 or specified regions before and after the coating. However, the coating state may alternatively be judged by comparing other pieces of information instead of the mean luminance values. Examples of the other information include a function indicating a luminance distribution for each bump P2 or specified region.

In the above embodiments, in the coating-inhibited region of the surface mounting component P, a part of the coating-inhibited region surrounded by four surface mounting components P is recognized as the specified region. However, this is a mere example and the specified region can be recognized by other methods. For example, a predetermined region interposed between two or more bumps P2 can be recognized as the specified region. FIG. 19A shows an example where a region in the vicinity of a center of two bumps P2 is recognized as the specified region. FIG. 19B shows an example where a region surrounded by three bumps P2 is recognized as the specified region. In those figures, pixels recognized by the controller as the specified region are represented by small squares U.

In the above embodiments, the soldering paste is taken as an example of the coating agent. However, it is also possible to use a flux, a conductive paste, an ACP (Anisotropic Conductive Paste), an NCP (Non Conductive Paste), or other liquid agents or pastes as the coating agent.

The present application contains subject matter related to that disclosed in Japanese Priority Patent Application JP 2008-096777 filed in the Japan Patent Office on Apr. 3, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A mounting apparatus, comprising:
   a coating unit to coat a first region of a coating target component as a coating target region with a coating agent;
   an acquiring means for acquiring first luminance information of the first region before being coated by the coating unit and second luminance information of the first region after being coated by the coating unit;
   a judging means for judging a quality of a coating state of the coating agent in the first region by comparing the first luminance information and the second luminance information; and
   a mounting mechanism to mount, on a mounting target object, the coating target component judged by the judging means that the coating state in the first region is favorable.

2. The mounting apparatus according to claim 1,
   wherein the acquiring means additionally acquires third luminance information of a second region of the coating target component before being coated by the coating unit, the second region being a coating-inhibited region other than the first region, and fourth luminance information of the second region after being coated by the coating unit,
   wherein the judging means additionally judges whether there is an erroneous coating in the second region by comparing the third luminance information and the fourth luminance information, and
   wherein the mounting mechanism mounts the coating target component judged by the judging means that the coating state of the coating agent in the first region is favorable and there is no erroneous coating in the second region.

3. The mounting apparatus according to claim 1,
   wherein the coating target component is a circuit device, and
   wherein the first region is constituted of a plurality of bumps provided to the circuit device.

4. The mounting apparatus according to claim 3,
   wherein the acquiring means acquires the first luminance information and the second luminance information for each of the plurality of bumps, and
   wherein the judging means judges the quality of the coating state in the first region by comparing the first luminance information and the second luminance information for each of the plurality of bumps.

5. The mounting apparatus according to claim 1,
   wherein the acquiring means is an imaging mechanism to acquire one of position information of the coating target component and information on whether the coating target component is adaptable.

6. The mounting apparatus according to claim 1,
   wherein the coating unit includes a plate to accommodate the coating agent,
   the mounting apparatus further comprising
   a detecting means for detecting an amount of the coating agent accommodated on the plate by the comparison by the judging means.

7. The mounting apparatus according to claim 6,
   wherein the coating unit includes an adjusting means for adjusting, based on the amount of the coating agent detected by the detecting means, the amount of the coating agent on the plate.

8. An inspecting apparatus inspecting a coating state of a coating agent in a coating target region of a coating target component, comprising:

an acquiring means for acquiring first luminance information of the coating target region before being coated with the coating agent and second luminance information of the coating target region after being coated with the coating agent; and a judging means for judging a quality of the coating state of the coating agent in the coating target region by comparing the first luminance information and the second luminance information.

9. A mounting method, comprising:

acquiring first luminance information of a coating target region of a coating target component;

coating, after acquiring the first luminance information, the coating target region with a coating agent;

acquiring second luminance information of the coating target region after being coated with the coating agent;

judging a quality of a coating state of the coating agent in the coating target region by comparing the first luminance information and the second luminance information; and mounting, on a mounting target object, the coating target component judged that the coating state in the coating target region is favorable.

10. An inspecting method, comprising:

acquiring first luminance information of a coating target region of a coating target component before being coated with a coating agent;

acquiring second luminance information of the coating target region after being coated with the coating agent; and judging a quality of a coating state of the coating agent in the coating target region by comparing the first luminance information and the second luminance information.

11. An inspecting apparatus inspecting a coating state of a coating agent in a coating target region of a coating target component, comprising:

an acquiring portion for acquiring first luminance information of the coating target region before being coated with the coating agent and second luminance information of the coating target region after being coated with the coating agent; and a judging portion for judging a quality of the coating state of the coating agent in the coating target region by comparing the first luminance information and the second luminance information.

* * * * *